United States Patent
Asanuma et al.

(10) Patent No.: US 9,941,753 B2
(45) Date of Patent: Apr. 10, 2018

(54) POWER TRANSMISSION APPARATUS FOR DETECTING RELATIVE POSITION OF RESONATORS BASED ON A COUPLING COEFFICIENT

(71) Applicant: Panasonic Intellectual Property Management Co., Ltd., Osaka (JP)

(72) Inventors: Kenichi Asanuma, Kyoto (JP); Hiroshi Yamamoto, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 564 days.

(21) Appl. No.: 14/565,895

(22) Filed: Dec. 10, 2014

(65) Prior Publication Data

US 2015/0180286 A1    Jun. 25, 2015

(30) Foreign Application Priority Data

Dec. 19, 2013   (JP) .................................. 2013-262228

(51) Int. Cl.
*H02J 17/00* (2006.01)
*H02J 50/90* (2016.01)
(Continued)

(52) U.S. Cl.
CPC .............. *H02J 50/90* (2016.02); *G01B 7/003* (2013.01); *G01R 27/2611* (2013.01);
(Continued)

(58) Field of Classification Search
CPC .............. H04B 5/00; H02J 50/00; H02J 50/90
(Continued)

(56) References Cited

U.S. PATENT DOCUMENTS

2008/0157603 A1* 7/2008 Baarman ................. H02J 7/025
307/104
2010/0270867 A1* 10/2010 Abe ......................... H02J 7/025
307/104
(Continued)

FOREIGN PATENT DOCUMENTS

EP    2 711 946      3/2014
JP    2009-118587    5/2009
(Continued)

OTHER PUBLICATIONS

Extended European Search Report dated May 4, 2015 in corresponding European patent application No. 14196203.5.

*Primary Examiner* — Adi Amrany
(74) *Attorney, Agent, or Firm* — Wenderoth, Lind & Ponack, L.L.P.

(57) ABSTRACT

A power transmission apparatus oscillates alternating current power at a first frequency (f1) which is lower than a resonant frequency (fr) of the second resonator and at a second frequency (f2) which is higher than the resonant frequency (fr). The power transmission apparatus measures an inductance value Lin (f1) and an inductance value Lin (f2). The inductance value Lin (f1) is measured when the oscillation circuit oscillates alternating current power at the first frequency (f1), and the inductance value Lin (f2) is measured when the oscillation circuit oscillates alternating current power at the second frequency (f2). The power transmission apparatus calculates a coupling coefficient k by using an expression represented by $k^2=1-Lin(f2)/Lin(f1)$, to detect relative position of the second resonator to the first resonator on the basis of the coupling coefficient k.

13 Claims, 14 Drawing Sheets

(51) Int. Cl.
*H02J 50/12* (2016.01)
*H02J 5/00* (2016.01)
*H02J 7/02* (2016.01)
*G01B 7/00* (2006.01)
*G01R 27/26* (2006.01)

(52) U.S. Cl.
CPC .............. *H02J 5/005* (2013.01); *H02J 7/025* (2013.01); *H02J 17/00* (2013.01); *H02J 50/12* (2016.02); *G01B 2210/58* (2013.01)

(58) Field of Classification Search
USPC .......................................................... 307/104
See application file for complete search history.

(56) References Cited

U.S. PATENT DOCUMENTS

| | | | | |
|---|---|---|---|---|
| 2011/0316348 A1* | 12/2011 | Kai | .......................... | H02J 17/00 307/104 |
| 2013/0002034 A1 | 1/2013 | Onizuka et al. | | |
| 2013/0076306 A1* | 3/2013 | Lee | .......................... | H02J 7/025 320/108 |
| 2013/0169221 A1 | 7/2013 | Suzuki et al. | | |
| 2013/0257165 A1* | 10/2013 | Singh | ........................ | H02J 17/00 307/98 |
| 2014/0001881 A1* | 1/2014 | Murakami | ............... | H02J 5/005 307/104 |
| 2014/0021798 A1* | 1/2014 | Kesler | ..................... | H02J 17/00 307/104 |
| 2014/0175897 A1* | 6/2014 | Taguchi | ................. | H01M 10/46 307/104 |
| 2014/0333144 A1* | 11/2014 | Ikeuchi | ................... | H01F 38/14 307/104 |
| 2015/0349542 A1* | 12/2015 | Yamamoto | ............... | G01V 3/10 307/104 |
| 2016/0149442 A1* | 5/2016 | Asanuma | ................ | H02J 50/60 307/104 |
| 2017/0179772 A1* | 6/2017 | Asanuma | ................ | H02J 17/00 |

FOREIGN PATENT DOCUMENTS

| | | |
|---|---|---|
| WO | 2007/107642 | 9/2007 |
| WO | 2011/033660 | 3/2011 |
| WO | 2012/157454 | 11/2012 |

\* cited by examiner

POWER TRANSMISSION APPARATUS FOR DETECTING RELATIVE POSITION OF RESONATORS BASED ON A COUPLING COEFFICIENT

CROSS REFERENCES TO RELATED APPLICATIONS

This application claims priority to Japanese Patent Application No. 2013-262228, filed on Dec. 19, 2013, the contents of which are hereby incorporated by reference.

BACKGROUND

1. Technical Field

The present disclosure relates to a position detection device for detecting a relative position of one resonator to another resonator. The present disclosure also relates to a power transmission apparatus and a power reception apparatus including such a position detection device and implementing wireless power transfer for transmitting power in a non-contact manner, and also to a wireless power transfer system including such a power transmission apparatus and power reception apparatus.

2. Description of the Related Art

These days, for audiovisual (AV) machines and electronic devices involving the mobility, such as cellular phones and electric vehicles, various wireless power transfer systems for performing wireless charging are being developed. There are various methods for implementing wireless power transfer technologies, such as an electromagnetic induction method and a magnetic-field resonance method utilizing a plurality of coils opposing each other, and an electric-field coupling method utilizing a plurality of metal plates opposing each other. An example of a wireless power transfer system utilizing the electromagnetic induction method is disclosed in International Publication No. 2011/033660 pamphlet. This wireless power transfer system includes a power transmission apparatus having a power transmission coil (power transmission antenna) and a power reception apparatus having a power reception coil (power reception antenna). Then, a magnetic field generated by the power transmission coil is trapped by the power reception coil, thereby transmitting power from the power transmission apparatus to the power reception apparatus without involving direct contact of electrodes.

International Publication No. 2007/107642 pamphlet discloses an example of a wireless power transfer system utilizing the electric-field coupling method.

In the above-described wireless power transfer systems, if the power transmission coil and the power reception coil are displaced from each other when performing power transfer, not only the power transmission efficiency is decreased, but also a metallic foreign substance disposed outside the power transmission coil or the power reception coil may be heated due to leakage flux from the power transmission coil or the power reception coil. Accordingly, the positional adjustment of a power transmission coil and a power reception coil may be important for implementing safe, high-efficiency wireless power transfer.

SUMMARY

In the related art, however, a power transmission apparatus that is capable of performing high-precision positional adjustment between a power transmission coil and a power reception coil is still demanded.

Additional benefits and advantages of the disclosed embodiments will be apparent from the specification and Figures. The benefits and/or advantages may be individually provided by the various embodiments and features of the specification and drawings disclosure, and need not all be provided in order to obtain one or more of the same.

In one general aspect, the techniques disclosed here feature a power transmission apparatus that oscillates alternating current power at a first frequency (f1) which is lower than a resonant frequency (fr) of the second resonator and at a second frequency (f2) which is higher than the resonant frequency (fr). The power transmission apparatus detects an inductance value Lin (f1) and an inductance value Lin (f2). The inductance value Lin (f1) is measured when the oscillation circuit oscillates alternating current power at the first frequency (f1), and the inductance value Lin (f2) is measured when the oscillation circuit oscillates alternating current power at the second frequency (f2). The power transmission apparatus calculates a coupling coefficient k by using an expression represented by $k^2=1-\text{Lin}(f2)/\text{Lin}(f1)$, to detect relative position of the second resonator to the first resonator on the basis of the coupling coefficient k.

In one general aspect, it is possible to provide a power transmission apparatus that is capable of performing high-precision positional adjustment between a power transmission coil and a power reception coil.

These general and specific aspects may be implemented using a system, a method, an integrated circuit, a computer program, a storage medium, and any combination of systems, methods, integrated circuits, computer programs, and storage media.

DETAILED DESCRIPTION

Figure 1:
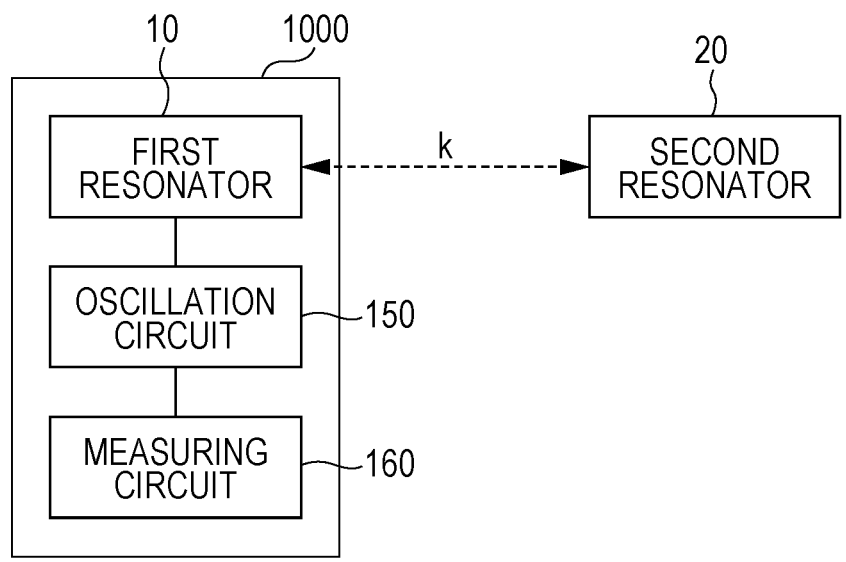
FIG. 1 is a block diagram illustrating the basic configuration of a position detection device according to a non-limiting, exemplary embodiment of the present disclosure.

Underlying Knowledge Forming Basis of the Present Disclosure

The inventors of the present disclosure have found that the power transmission apparatuses used in the wireless power transfer systems discussed above present the following problems.

In the wireless power transfer system disclosed in International Publication No. 2011/033660 pamphlet, the power transmission apparatus changes a load of the power reception apparatus and measures a reflection coefficient in a predetermined frequency range. Then, a coupling coefficient between the power transmission coil and the power reception coil is estimated from a difference between a certain frequency and a frequency at which the reflection coefficient is minimized. Then, the positional adjustment between the power transmission coil and the power reception coil is performed on the basis of the estimated coupling coefficient.

However, in the wireless power transfer system disclosed in this publication, the coupling coefficient can be accurately estimated only when parameters, such as a first resonator disposed in the power transmission apparatus, a second resonator disposed in the power reception apparatus, and a load, are fixed. Accordingly, if a load is changed, it the coupling coefficient is not accurately estimated. Additionally, it is necessary to control the load of the power reception apparatus and also to measure a wide range of reflection coefficients, thereby decreasing the efficiency of positional adjustment control and thus presenting the problem in terms of the fast responsiveness of the positional adjustment.

Additionally, the coupling coefficient to be estimated in this positional adjustment control is different from a coupling coefficient k, which is calculated by an expression represented by $k^2=1-Lin(f2)/Lin(f1)$. The coupling coefficient k will be discussed later.

International Publication No. 2007/107642 pamphlet discloses an example of a wireless power transfer system using the electric-field coupling method. This publication does not disclose positional adjustment based on a coupling coefficient k, which is an index for detecting the relative position of a second resonator to a first resonator.

Japanese Unexamined Patent Application Publication No. 2009-118587 discloses a coupling coefficient ki, which is an index for detecting the relative position of a second resonator to a first resonator and which is calculated by an equation expressed by $ki^2=1-Ls/Lw$. The coupling coefficient k indicates the ratio of magnetic flux passing through a second coil of the second resonator to the entire magnetic flux output from a first coil of the first resonator. Accordingly, if the load of the power reception apparatus changes, the magnetic flux density varies, but the ratio of magnetic flux passing through the second coil to the entire magnetic flux output from the first coil does not vary. Thus, since the coupling coefficient is an index resistant to a change in the load, the use of the coupling coefficient k is suitable for performing positional adjustment control.

In the wireless power transfer system disclosed in this publication, in order to calculate the coupling coefficient ki, the inductance Lw of the first resonator when both ends of the second coil are opened is measured, and then, the inductance Ls of the first resonator when both ends of the second coil short-circuit is measured. The measurements of the inductance Lw and the inductance Ls are conducted at the same frequency fc (for example, see paragraph [0362] and FIG. 73 of this publication).

However, in this publication, a method for switching between the state in which both ends of the second coil are opened and the state in which both ends of the second coil are short-circuit is not disclosed.

Generally, for switching between the above-described two states, for example, a short-circuiting switch is provided at both ends of the second coil of the power reception apparatus, and a control circuit for controlling the short-circuiting switch is provided in the power reception apparatus. Then, a signal is sent from the power transmission apparatus to the power reception apparatus to control the short-circuiting switch. Accordingly, the provision of the short-circuiting switch and the control circuit increases the number of components. It is also necessary to send a signal from the power transmission apparatus to the power reception apparatus so as to control the electrical connection and disconnection between both ends of the second coil performed by the short-circuiting switch. This is very cumbersome, and the cost is also increased.

It is thus desirable to provide a power transmission apparatus that is capable of performing high-precision positional adjustment between a power transmission coil and a power reception coil with a simple configuration and without increasing the cost even if a load is changed.

After conducting the above-described examination, the present inventors have conceived the following aspects of the disclosure.

According to an aspect of the present disclosure, there is provided a power transmission apparatus for detecting a position of a power reception apparatus that includes a load and a second resonator which is constituted by a parallel resonance circuit having a second coil and a capacitor. The power transmission apparatus includes: a first resonator including a first coil; an oscillation circuit that oscillates alternating current power at a first frequency (f1) which is lower than a resonant frequency (fr) of the second resonator and at a second frequency (f2) which is higher than the resonant frequency (fr); and a measuring circuit that measures an inductance value of the first resonator when the first resonator and the second resonator are electromagnetically coupled to each other. The measuring circuit measures an input inductance value Lin(f1) of the first resonator when the oscillation circuit oscillates alternating current power at the first frequency (f1) and an input inductance value Lin(f2) of the first resonator when the oscillation circuit oscillates alternating current power at the second frequency (f2), and calculates a coupling coefficient k by using an expression represented by $k^2=1-Lin(f2)/Lin(f1)$, thereby detecting a relative position of the second resonator to the first resonator on the basis of the coupling coefficient k.

According to the above-described aspect, by disposing a capacitor at both ends of the second coil, a parallel resonance circuit including a coil and a capacitor is provided in the power reception apparatus. With this arrangement, when the power reception apparatus is driven as a result of the oscillation circuit oscillating AC power at the first frequency (f1) lower than the resonant frequency (fr) of the second resonator, a current does not flow into the capacitor, thereby creating a state in which both ends of the second coil are substantially opened. On the other hand, when the power reception apparatus is driven as a result of the oscillation circuit oscillating AC power at the second frequency (f2) higher than the resonant frequency (fr), a current flows into the capacitor, thereby creating a state in which both ends of the second coil short-circuit.

Accordingly, in order to measure the inductance value Lin(f1) of the first resonator in the state in which both ends of the second resonator are substantially opened, the oscillation circuit oscillates AC power at the first frequency (f1), and then, the inductance value Lin(f1) of the first resonator is measured. On the other hand, in order to measure the inductance value Lin(f2) of the first resonator in the state in which both ends of the second resonator short-circuit, the oscillation circuit oscillates AC power at the second frequency (f2), and then, the inductance value Lin(f2) of the first resonator is measured. As a result, the coupling coefficient can be calculated from the measured inductance values Lin(f1) and Lin(f2) of the first resonator.

Thus, according to an aspect of the present disclosure, by merely providing a capacitor at both ends of the second coil, it is possible to create a state in which both ends of the second coil are substantially opened and a state in which both ends of the second coil short-circuit. Thus, it is not necessary to provide the above-described short-circuiting switch and control circuit in the power reception apparatus, nor does it necessary to send a signal from the transmission apparatus to control the short-circuiting switch. As a result, since positional adjustment is performed by using the coupling coefficient, the power transmission apparatus is able to perform high-precision positional adjustment with a simple configuration and without increasing the cost even if a load is changed.

Japanese Unexamined Patent Application Publication No. 2009-118587 does not disclose a power reception apparatus including a second resonator constituted by a parallel resonance circuit having the above-described second coil and a capacitor. Accordingly, a state in which both ends of the second coil are substantially opened is not created even if the power reception apparatus is driven as a result of the oscillation circuit oscillating AC power at the first frequency (f1) lower than the resonant frequency (fr) of the second resonator, nor does it possible to create a state in which both ends of the second coil short-circuit even if the power reception apparatus is driven as a result of the oscillation circuit oscillating AC power at the second frequency (f2) higher than the resonant frequency (fr) of the second resonator.

Note that the definition of the coil in "both ends of a coil (second coil)" is not restricted to a single coil component. For example, as in a wireless power transfer system shown in FIG. 15, which will be discussed later, a power reception coil and a series resonance capacitor (for example, a capacitor C2s) are included in a power reception resonator.

In this case, if series impedance constituted by the power reception coil and the series resonance capacitor appears to be inductive at the frequencies f1 and f2 at which position detection is performed, it may also be treated as an equivalent coil. Accordingly, by providing a parallel capacitor at both ends of this equivalent coil, advantages similar to the above-described advantages may be obtained. Thus, the definition of the coil in "both ends of a coil (second coil)" is not restricted to a single coil component (see a description of FIG. 15).

Prior to a description of specific embodiments of the present disclosure, the basic configuration of a position detection device of the disclosure will be explained. Reference will first be made to FIG. 1, which is a block diagram illustrating the basic configuration of a position detection device 1000 according to a non-limiting, exemplary embodiment of the present disclosure.

The position detection device 1000 shown in FIG. 1 includes a first resonator 10, an oscillation circuit 150 connected to the first resonator 10, and a measuring circuit 160 connected to the oscillation circuit 150. The position detection device 1000 detects a relative position of a second resonator 20 to the first resonator 10 that is electromagnetically coupled to the second resonator 20. The second resonator 20 is constituted by a parallel resonance circuit including a coil and a capacitor.

The oscillation circuit 150 oscillates at a first frequency (f1) which is lower than a resonant frequency (fr) of the second resonator 20 and at a second frequency (f2) which is higher than the resonant frequency (fr). The measuring circuit 160 measures an input inductance value of the first resonator 10. The measuring circuit 160 detects a relative position of the second resonator 20 to the first resonator 10 on the basis of the ratio between an input inductance value Lin(f1) of the first resonator 10 measured by the measuring circuit 160 when the oscillation circuit 150 oscillates at the first frequency f1 and an input inductance value Lin(f2) of the first resonator 10 measured by the measuring circuit 160 when the oscillation circuit 150 oscillates at the second frequency f2. That is, by using the ratio Lin(f1)/Lin(f2), which is the ratio of the input inductance values, a coupling coefficient k between the first resonator 10 and the second resonator 20 may be calculated or estimated. This will be discussed in detail later. The coupling coefficient k varies in accordance with the relative position of the second resonator 20 to the first resonator 10. That is, when the first resonator 10 and the second resonator 20 are not electromagnetically coupled to each other, the coupling coefficient k is zero or a small value approximating to zero. Conversely, when the first resonator 10 and the second resonator 20 are electromagnetically coupled to each other, the coupling coefficient k is changed as follows. When the second resonator 20 is approaching the first resonator 10, the coupling coefficient k is increased, and when the second resonator 20 is separating from the first resonator 10, the coupling coefficient k is decreased. Accordingly, it is possible to determine the relative position of the second resonator 20 to the first resonator 10 on the basis of a calculated value or an estimated value of the coupling coefficient k.

One feature of a position detection device of an embodiment of the disclosure is the use of the ratio between two input inductance values obtained at different frequencies, that is, Lin(f1)/Lin(f2). In the present disclosure, measurements of input inductance values of the first resonator 10 include, not only measurements of input inductance values per se, but also measurements of another physical parameter converted from input inductance values. Under a certain condition, the frequency of an electromagnetic field for electromagnetically coupling the first resonator 10 to the second resonator 20 is proportional to the input inductance value (for example, the frequency in a voltage-to-frequency converter). Under another condition, the frequency of an electromagnetic field for electromagnetically coupling the first resonator 10 to the second resonator 20 is inversely proportional to the square of the input inductance value (for example, the oscillation frequency in a self-excited oscillation circuit). Accordingly, by measuring the frequency of an AC current or an AC voltage flowing through the first resonator 10 or the second resonator 20, "the input inductance value of the first resonator" may be effectively measured, and as a result, the value of the coupling coefficient k can be obtained.

The term "relative position" in the present disclosure is not an absolute position in space coordinates, but "relative distance information", which is a basis for detecting in real time whether the second resonator 20 is approaching the first resonator 10 or is separating from the first resonator 10.

Figure 2:
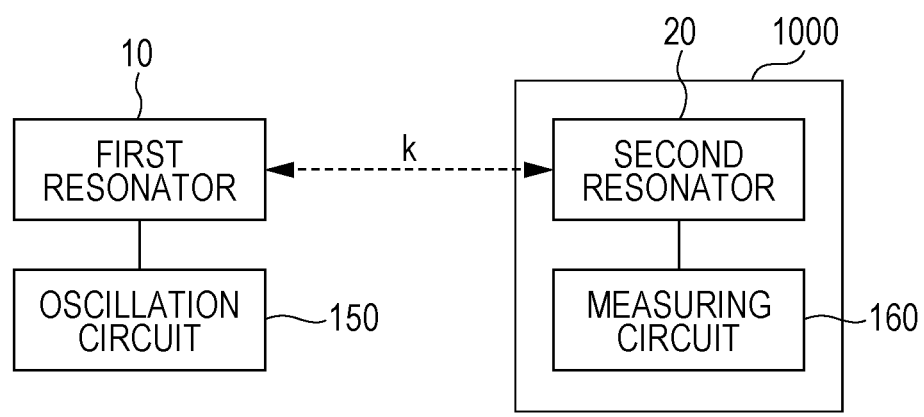
FIG. 2 is a block diagram illustrating an example of the configuration of a position detection device in which a measuring circuit is connected to a second resonator and an oscillation circuit is connected to a first resonator.
Figure 3:
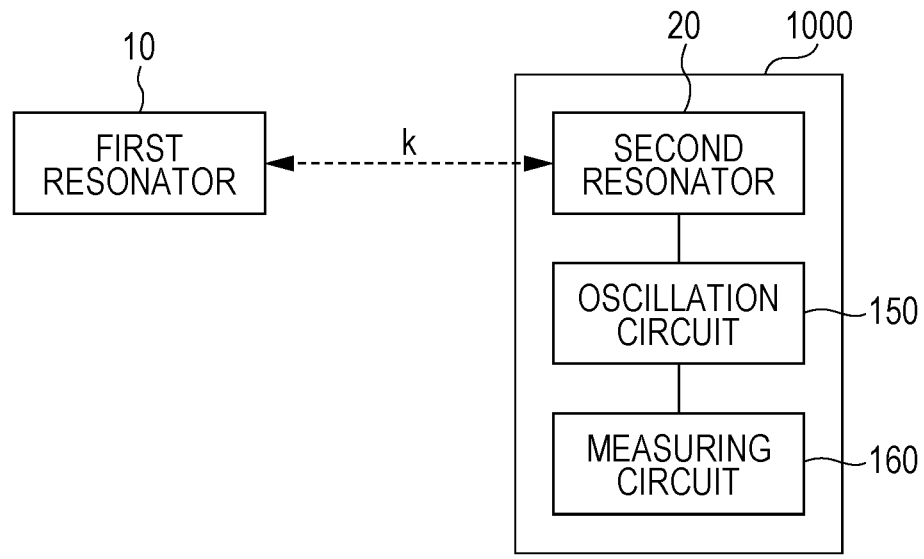
FIG. 3 is a block diagram illustrating an example of the configuration of a position detection device in which both of an oscillation circuit and a measuring circuit are connected to a second resonator.

Other examples of the configuration of the position detection device 1000, that is, the position detection device 1000 including the second resonator 20, will now be described below with reference to FIGS. 2 and 3. In the example shown in FIG. 2, the measuring circuit 160 is connected to the second resonator 20, and the oscillation circuit 150 is connected to the first resonator 10. In the example shown in FIG. 3, both of the oscillation circuit 150 and the measuring circuit 160 are connected to the second resonator 20. In these examples, the second resonator 20 is included in the position detection device 1000, and thus, the second resonator 20 moves in accordance with the movement of the position detection device 1000.

Figure 4:
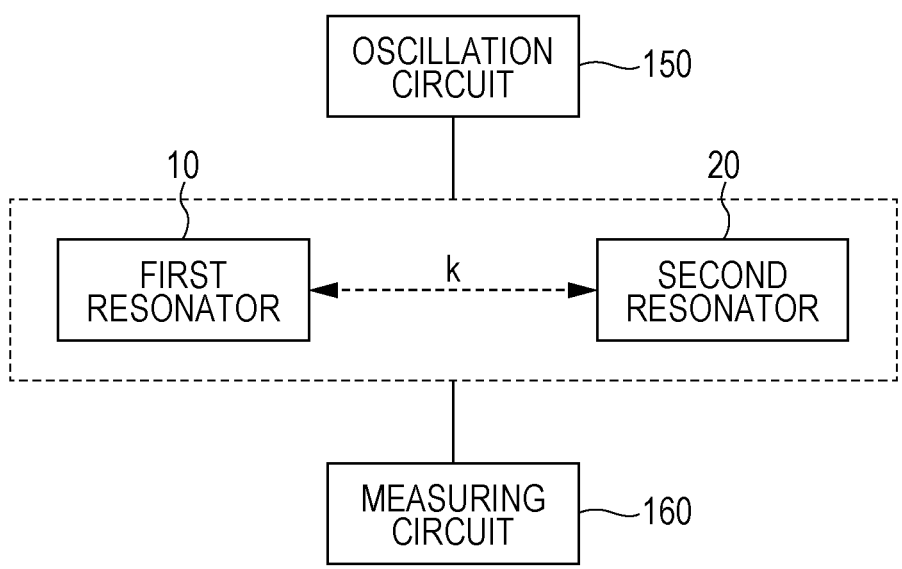
FIG. 4 is a block diagram illustrating the basic operation of a position detection device according to an embodiment of the present disclosure.

The basic operation of the position detection device 1000 will now be described below with reference to FIG. 4. The oscillation circuit 150 may be connected to either one of the first resonator 10 and the second resonator 20 or may be connected to both of the first resonator 10 and the second resonator 20 as long as it is capable of generating oscillation of an electric field or a magnetic field for implementing electromagnetic coupling between the first resonator 10 and the second resonator 20 at frequencies f1 and f2, as discussed above. As long as the first resonator 10 and the second resonator 20 are electromagnetically coupled to each other, the measuring circuit 160 is able to detect the coupling coefficient k by directly or indirectly measuring the input inductance value of the first resonator 10 or the second resonator 20, regardless of whether the measuring device 160 is connected to the first resonator 10 or the second resonator 20.

The position detection device 1000 of an embodiment of the disclosure may be constituted by at least one of components of a power transmission apparatus or a second power reception apparatus in a wireless power transfer system. Accordingly, the position detection device 1000 may suitably be used in the wireless power transfer system. However, the position detection device 1000 may be used for another purpose of use. For example, one of the first resonator 10 and the second resonator 20 may be included in a radio frequency (RF) tag. The RF tag is an element including a memory for storing information (storage element) and an antenna for performing wireless transmission and reception of data so as to perform radio frequency identification (RFID). The RF tag is also called an electronic tag, an integrated circuit (IC) tag, a wireless tag, or an RFID tag.

Embodiments of the present disclosure will be described below in detail with reference to the accompanying drawings. In the drawings, similar components are indicated by like reference numerals.

First Embodiment

Figure 5:
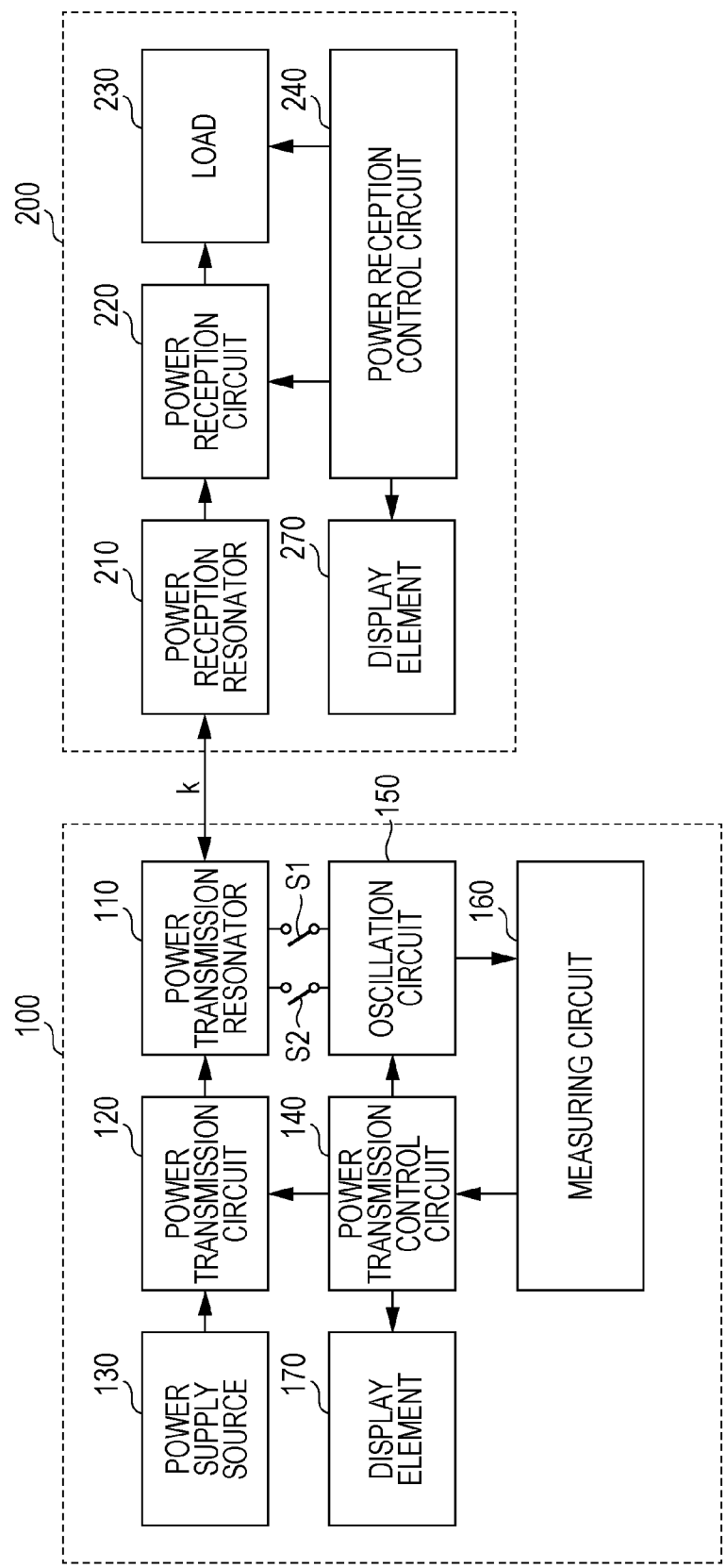
FIG. 5 is a block diagram illustrating the schematic configuration of a wireless power transfer system according to a first embodiment of the present disclosure.

FIG. 5 is a block diagram illustrating the schematic configuration of a wireless power transfer system according to a first embodiment of the disclosure. This wireless power transfer system includes a power transmission apparatus 100 and a power reception apparatus 200, and is capable of wirelessly transmitting power from the power transmission apparatus 100 to the power reception apparatus 200. The power transmission apparatus 100 is, for example, a wireless charger, and the power reception apparatus 200 is, for example, a device including secondary batteries, such as a mobile information terminal or an electric vehicle. In the first embodiment, the above-described position detection device is disposed in the power transmission apparatus 100. Accordingly, the power transmission apparatus 100, not only transmits power to the power reception apparatus 200, but also detects whether or not a power reception resonator 210 of the power reception apparatus 200 is located at a suitable position (position at which the power reception apparatus 200 can be charged) with respect to a power transmission resonator 110 of the power transmission apparatus 100. In this specification, this detection is referred to as "positional adjustment". A detection result is supplied to a user as information in the form of light, video, or sound emitted from a display element 170 disposed in the power transmission apparatus 100 or a display element 270 disposed in the power reception apparatus 200, such as a light source, a display, or a speaker. The term "display element" in this specification is not restricted to an element presenting visual information, but also includes an element presenting only audio information (sound or voice).

Due to the function of the position detection device provided in the wireless power transfer system of the first embodiment, when a user moves the power reception apparatus 200 close to the power transmission apparatus 100, the user can tell whether or not the power reception resonator 210 has reached a suitable position at which it is able to receive power, thereby facilitating the positional adjustment of the power reception apparatus 200.

As shown in FIG. 5, the power transmission apparatus 100 of the first embodiment includes a power transmission resonator 110, a power transmission circuit 120, a power supply source 130, a power transmission control circuit 140, an oscillation circuit 150, a measuring circuit 160, and a display element 170. Among these components, the power transmission resonator 110, the oscillation circuit 150, and the measuring circuit 160 form the position detection device. The configuration and the operation of the position detection device will be discussed below.

The power transmission resonator 110 is a resonance circuit (first resonance circuit) including a power transmission coil L1 and a capacitor C1 connected in series with each other, which will be described in detail later with reference to FIG. 15. The resonance state of the power transmission resonator 110 is controlled by the oscillation circuit 150. In the first embodiment, a first resonator for performing position detection also serves as a power transmission resonator for performing wireless power transfer.

The oscillation circuit 150 is connected to the power transmission resonator 110, and is capable of oscillating at two frequencies different from a resonant frequency fr of the power reception resonator 210. These two frequencies are set to be a first frequency f1 lower than the resonant frequency fr and a second frequency f2 higher than the resonant frequency fr. The first frequency f1 may be set to be, for example, 85% or lower of the resonant frequency fr, while the second frequency f2 may be set to be, for example, 115% or higher of the resonant frequency fr. In a power transfer mode, AC energy of the resonant frequency fr of the power reception resonator 210 of the power reception apparatus 200 is transmitted from the power transmission resonator 110 to the power reception resonator 210. It is not necessary that the frequency of the power transfer mode coincide with the resonant frequency fr of the power reception resonator 210, and it may be set to be a value in a range of about 85 to 115% of the resonant frequency fr. It is not even necessary that the frequency of the power transfer mode be set to be in a range of about 85 to 115% of the resonant frequency fr of the power reception resonator 210, and it may be set to be a frequency band different from this range. For example, the frequency of the power transfer mode may be set to be about 100 to 200 kHz, and the position detection frequency fr may be set to be about 1000 kHz. Details thereof will be discussed later in a third embodiment.

The measuring circuit 160 detects a change in the frequency (oscillation frequency) of AC energy output from the oscillation circuit 150 so as to detect the position of the power reception resonator 210. That is, the measuring circuit 160 measures an inductance value Lin(f1) of the power transmission resonator 110 when the oscillation circuit 150 oscillates at the first frequency f1. The measuring circuit 160 also measures an inductance value Lin(f2) of the power transmission resonator 110 when the oscillation circuit 150 oscillates at the second frequency f2. Then, the measuring circuit 160 detects a relative position of the power reception resonator 210 to the power transmission resonator 110 on the basis of the ratio between the two inductance values Lin(f1) and Lin(f2) according to a certain principle, which will be discussed later.

The power reception apparatus 200 will be briefly described below. The power reception apparatus 200 includes a power reception resonator 210, a power reception circuit 220, a load 230, a power reception control circuit 240, and a display element 270. The power reception resonator 210 is a resonance circuit (second resonance circuit) including a power reception coil L2 and a capacitor C2 connected in parallel with each other, which will be described in detail later with reference to FIG. 15. The resonant frequency of the power reception resonator 210 is set to be a value fr. AC energy received by the power reception resonator 210 from the power transmission resonator 110 via a space in a non-contact manner is subjected to waveform conversion in the power reception circuit 220, and is then supplied to the load 230.

In the first embodiment, wireless power transfer is performed through magnetic-field resonance using a pair of coils. However, wireless power transfer may be performed through electric-field resonance using a pair of capacitors. A position detection device of an embodiment of the present disclosure is applicable, not only to the positional adjustment of a pair of coils, but also to the positional adjustment of a pair of capacitors. The principle of the positional adjustment will now be discussed below by taking the positional adjustment of a pair of coils as an example. However, this principle is applicable to the positional adjustment of a pair of capacitors.

Figure 6:
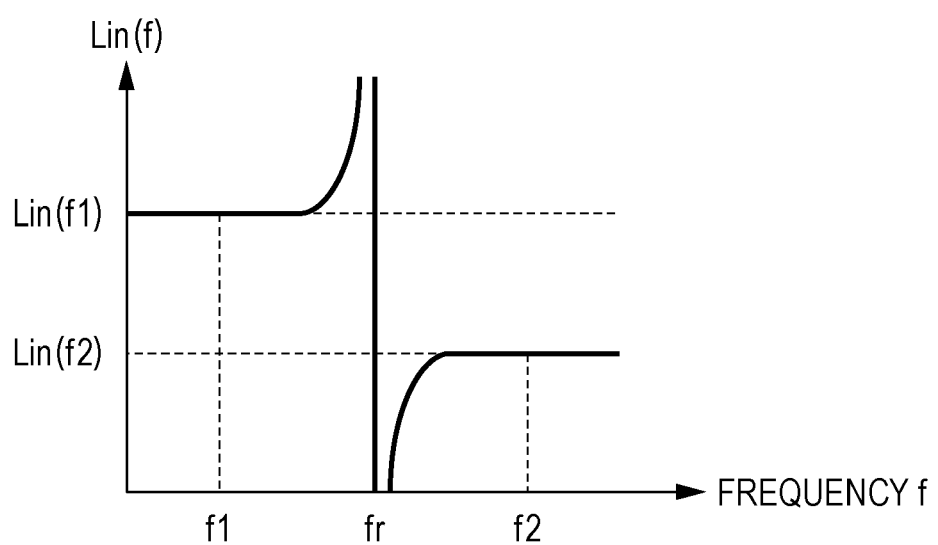
FIG. 6 is a graph for explaining the principle of the operation of the wireless power transfer system of the first embodiment.

FIG. 6 is a graph for explaining the principle of a coupling coefficient estimating method used for the positional adjustment performed in the first embodiment. A method for estimating a coupling coefficient between a pair of coils will be explained.

When the power transmission coil L1 (the inductance value is also indicated by L1) and the power reception coil L2 (the inductance value is also indicated by L2) which oscillates at the frequency fr are electromagnetically coupled to each other with the coupling coefficient k, the input inductance Lin as viewed from the power transmission coil L1 may be found by expression (1).

$$Lin(f) = L1\{1 - k^2/(1-(fr/f)^2)\} \quad (1)$$

FIG. 6 is a graph schematically illustrating expression (1).

When the frequency f is much lower than the resonant frequency fr (f<<fr), both ends of the power reception resonator 210 appear to be substantially opened. The input inductance value measured at the first frequency f1 which is lower than the resonant frequency fr is set to be Lin(f1). On the other hand, when the frequency f is much higher than the resonant frequency fr (f>>fr), both ends of the parallel capacitor of the power reception resonator 210 appear to substantially short-circuit. The input inductance value measured at the second frequency f2 which is higher than the resonant frequency fr is set to be Lin(f2).

If the first frequency f1 and the second frequency f2 are set to be suitable values, the following approximate expressions are obtained from expression (1).

$$Lin(f1) \approx L1$$

$$Lin(f2) \approx L1(1-k^2)$$

From these two approximate expressions, expression (2) is obtained.

$$k^2 \approx 1 - Lin(f2)/Lin(f1) \quad (2)$$

According to expression (2), the coupling coefficient k can be calculated on the basis of the ratio of Lin(f2) to Lin(f1), which are measured values. However, expression (2) is based on the special conditions that the input inductance Lin_open(f) measured when both ends of the power reception coil L2 are fully opened and the input inductance Lin_short(f) measured when both ends of the power reception coil L2 short-circuit satisfy the following expressions (3) and (4).

$$Lin\_open(f1) = Lin\_open(f2) \quad (3)$$

$$Lin\_short(f1) = Lin\_short(f2) \quad (4)$$

In other words, if a wireless power transfer system is designed after selecting the frequencies f1 and f2 at which expressions (3) and (4) are established, expression (2) is established, and the coupling coefficient k can be estimated. Normally, there is no problem in practical use if the frequencies f1 and f2 are set to be in a range in which the dimensions of the resonators can be regarded as being sufficiently smaller than the wavelength.

If a self-excited oscillation circuit is used as the oscillation circuit 150, a change in the input inductance may be directly converted into a change in the oscillation frequency. That is, since the input inductance is determined by the reciprocal of the square of the oscillation frequency, the coupling coefficient k may be expressed by expression (5).

$$k^2 \approx 1 - f1^2/f^2 2 \quad (5)$$

In practical use, linear and nonlinear elements are included in the oscillation circuit, it is necessary to modify expressions (2) and (5). In principle, however, the coupling coefficient k can be estimated from expression (2) or (5). Details of examples of modifications made to expressions (2) and (5) will be discussed in a third embodiment.

Thus, if the input inductance values or oscillation frequencies corresponding to the frequencies f1 and f2 are measured while sequentially switching between the oscillating operation at the frequency f1 and that at the frequency f2, the coupling coefficient k can be estimated from the measurement results. The coupling coefficient k varies in accordance with the distance between the power transmission coil L1 and the power reception coil L2. Accordingly, when the estimated coupling coefficient k is equal to or greater than a predetermined threshold, it can be determined that the power reception coil L2 has reached a position at which the power reception coil L2 opposes the power transmission coil L1. Upon completion of the positional adjustment, the power transmission apparatus 100 stops the oscillation circuit 150 and starts transmitting power by using the power transmission circuit 120. With this operation, it is possible to perform safe, high-efficiency wireless power supply to the power reception apparatus 200.

The individual components of the wireless power transfer system shown in FIG. 5 will be discussed in detail. Details of the components of the power transmission apparatus 100 will be discussed first.

As stated above, the measuring circuit 160 and the oscillation circuit 150 form the position detection device of the first embodiment. The measuring circuit 160 measures electrical characteristics (input inductance, oscillation frequency, and parameters that vary in accordance with the input inductance or the oscillation frequency) of the power transmission resonator 110 (first resonator). The oscillation circuit 150 oscillates at two frequencies which are different from the resonant frequency of the power reception resonator 210 (second resonator).

The power transmission resonator 110 includes a power transmission coil L1 and a capacitor C1. As the power transmission coil L1, a thin planar coil constituted by a substrate pattern or a winding coil using copper wire, Litz wire, or twisted pair wire may be utilized. For securing sufficient detection sensitivity, the Q factor of the power transmission coil L1 may be set to be, for example, 100 or higher. However, the Q factor may be set to be smaller than 100. The capacitor C1 does not have to be included if it is not necessary, in which case, the power transmission resonator 110 may be formed by including self-resonance characteristics inherent in the power transmission coil L1.

The power transmission circuit 120 outputs AC energy for power transfer after the completion of the positional adjustment. The power transmission circuit 120 may be a full-bridge inverter or another type of power transmission circuit, such as a class D inverter or a class E inverter. The power transmission circuit 120 may include a communication modulation-and-demodulation circuit and various sensors for measuring voltages and currents.

The power supply source 130 may be commercial power supply, primary batteries, secondary batteries, solar cells, fuel cells, universal serial bus (USB) power supply, a high-capacity capacitor (for example, an electric double-layer capacitor), a voltage converter connected to commercial power supply, or all kinds of power supply sources that may be implemented by combining the above-described power supply sources.

The power transmission control circuit 140 is a processor that controls the entire operation of the power transmission apparatus 100, and may be implemented by a combination of a central processing unit (CPU) and a memory storing a computer program therein. Alternatively, the power transmission control circuit 140 may be dedicated hardware that implements the operation performed in the first embodiment. The power transmission control circuit 140 switches between the oscillation frequencies of the oscillation circuit 150, controls the power transmission performed by the power transmission circuit 120 (adjusts the power transmission state), and controls the light emission of the display element 170 on the basis of detection results obtained from the measuring circuit 160. More specifically, in a positional adjustment mode, the power transmission control circuit 140 stops the operation of the power transmission circuit 120 and drives the oscillation circuit 150, and conversely, in a power transfer mode, the power transmission control circuit 140 stops the operation of the oscillation circuit 150 and drives the power transmission circuit 120. The power transmission control circuit 140 determines the power transmission start frequency and the power transmission voltage in accordance with the measurement results obtained from the position detection device.

As the oscillation circuit 150, a known self-excited oscillation circuit based on the LC resonance principle, such as the Colpitts oscillator, Hartley oscillator, Clapp oscillator, Franklin oscillator, or Pierce oscillator, may be used. One of the features of the first embodiment is that an impedance change of the power transmission coil L1 is converted into a change in the frequency and is detected with high precision. As long as this feature is implemented, the oscillation circuit 150 is not restricted to the above type of oscillator, and another type of oscillator or another circuit topology may be used. If there is a possibility that the oscillation circuit 150 will be burnt when power is transmitted, a switch may be provided between the power transmission resonator 110 and the oscillation circuit 150 so that they can be electrically disconnected from each other when power is transmitted. If expression (2) is utilized for determining the coupling coefficient k, the functions of the oscillation circuit 150 are the same as the functions of the power transmission circuit 120. Thus, the oscillation circuit 150 and the power transmission circuit 120 may be integrated into a single circuit.

The measuring circuit 160 is used for calculating the input inductance by measuring the above-described oscillation frequencies or the voltage and the current of the power transmission coil L1. Although it is not shown, at least some of the functions of the measuring circuit 160 and at least some of the functions of the power transmission control circuit 140 may be implemented by a semiconductor package (for example, a microcontroller or a custom IC).

The display element 170 is used for informing a user of detection results obtained by the measuring circuit 160. The display element 170 functions as an indicator indicating a relative position of the power reception coil L2 to the power transmission coil L1 (how close the power reception coil L2 approaches the power transmission coil L1). The display element 170 may be constituted by a light source, such as light-emitting diode (LED) or an organic electroluminescence (EL), or may be a set of a plurality of light sources. In accordance with the distance between the power transmission coil L1 and the power reception coil L2, the display element 170 may change the light source among a plurality of light sources to emit light or may change the number of light sources to emit light in a stepwise manner. The display element 170 may be a display, such as a liquid crystal display element or an organic EL display element. By the use of a display, the detection results or the level of positional adjustment can be displayed by means of images or characters. The display element 170 may display detection results or the level of positional adjustment by means of sound or voice together with or instead of light.

The components of the power reception apparatus 200 will now be described below.

The power reception resonator 210 includes a power reception coil L2 and a capacitor C2. The power reception coil L2 and the capacitor C2 may be similar to the power transmission coil L1 and the capacitor C1, respectively, of the power transmission resonator 110. Alternatively, the power reception coil L2 and the capacitor C2 may be different from the power transmission coil L1 and the capacitor C1, respectively. The impedance $Z2=1/j\omega C2$ is set to be relatively high at the frequency f1 and to be relatively low at the frequency f2. In this expression, j is the imaginary unit and ω is the angular frequency, and $\omega = 2\pi \times \text{frequency}$ is established.

A series capacitor may be inserted between the power reception resonator 210 and the power reception circuit 220. The power reception resonator 210 does not have to include the capacitor C2 if it is not necessary, in which case, the power reception resonator 210 may be formed by including self-resonance characteristics inherent in the power reception coil L2.

The power reception circuit 220 includes various circuits, such as a rectifier circuit, a frequency converter circuit, a constant-voltage-and-constant-current control circuit, and a communication modulation-and-demodulation circuit. The power reception circuit 220 converts received AC energy into DC energy or low-frequency AC energy that can be used by the load 230. The power reception circuit 220 may also include various sensors for measuring the voltage and the current of the power reception resonator 210.

The load 230 is, for example, secondary batteries or a high-capacity capacitor, and may be charged by power output from the power reception circuit 220.

In the first embodiment, the power reception control circuit 240 is a processor that controls the entire operation of the power reception apparatus 200, and may be implemented by a combination of a CPU and a memory storing a computer program therein. Alternatively, the power reception control circuit 240 may be dedicated hardware that implements the operation performed in the first embodiment. The power reception control circuit 240 controls the charging and supply of power to the load 230 and also controls the display element 270.

The oscillation frequency used in the first embodiment may be set to be a low frequency range of about 20 kHz to 20 MHz in which the parallel capacitor C2 may be sufficiently regarded as a lumped parameter circuit. As the oscillation frequency is higher, the resolution is higher, and faster position detection can be performed. Accordingly, if the position detection is performed at an interval of 10 microseconds or smaller, the oscillation frequency may be set to be 100 kHz to 100 MHz, which is the reciprocal of the value of this interval. If fast position detection is not particularly required, the oscillation frequency may be set to be several kilohertz to 100 kHz.

A description will now be given, with reference to the flowchart of FIG. 7, of a positional adjustment operation of the wireless power transfer system of the first embodiment.

Upon sensing that the power reception resonator 210 is approaching the power transmission resonator 110, the power transmission apparatus 100 enters the positional adjustment mode. In the first embodiment, sensing that the power reception resonator 210 is approaching the power transmission resonator 110 is not based on the principle of the above-described position detection device, but based on the detection of a change in the oscillation frequency or the voltage. When the power reception resonator 210 is approaching the power transmission resonator 110, the oscillation frequency may be increased due to the influence of a metal (such as a ground electrode or a coil on a substrate) within the power reception resonator 210, or the amplitude of the voltage output from the oscillation circuit 150 may be decreased. If the power reception coil L2 of the power reception resonator 210 includes an electromagnetic shield (magnetic body) for reducing the influence of electromagnetic noise on peripheral circuits, the oscillation frequency may be decreased as the power reception resonator 210 is approaching the power transmission resonator 110. Accordingly, by detecting a change in the oscillation frequency or the voltage, the power transmission apparatus 100 is able to sense that the power reception resonator 210 is approaching the power transmission resonator 110. The power transmission control circuit 140 and the oscillation circuit 150 may perform intermittent oscillation (intermittent operation) for oscillating an alternating current for several intervals only in every millisecond or every several seconds, and upon sensing that the power reception coil L2 is approaching, they switch the intermittent operation to the continuous operation. By performing such an intermittent operation, the power transmission apparatus 100 is able to sense that the power reception coil L2 is approaching while suppressing an increase in the power consumption. The operating frequency of the oscillation circuit 150 when performing this intermittent operation may be the frequency f1 or another frequency.

In step S600, the power transmission control circuit 140 causes the oscillation circuit 150 to operate at the frequency f1.

In step S601, the measuring circuit 160 measures the input inductance after the lapse of a predetermined time.

In step S602, the power transmission control circuit 140 causes the oscillation circuit 150 to operate at the frequency f2.

In step S603, the measuring circuit 160 measures the input inductance after the lapse of a predetermined time.

In step S604, the coupling coefficient k is calculated on the basis of the obtained measurement results by using expression (2). Then, in step S605, it is determined whether or not the coupling coefficient k exceeds a predetermined first threshold. The first threshold is set to be, for example, 0.3 to 0.5. If the calculated coupling coefficient k exceeds the predetermined first threshold, it can be determined that the power reception coil L2 has approached close enough to the power transmission coil L1. Thus, the process proceeds to step S606. The measuring circuit 160 supplies information that the power reception coil L2 has approached close enough to the power transmission coil L1 to the power transmission control circuit 140. Upon receiving this information, the power transmission control circuit 140 stops the oscillation of the oscillation circuit 150. In this case, the power transmission control circuit 140 may cause the display element 170 to emit light or the display element 270 to display information that the positional adjustment has been completed. In this manner, a user is informed that the positional adjustment has been completed. If the power transmission control circuit 140 has such a communication function, it also serves as a light source control circuit or a display control circuit.

Thereafter, the power transmission control circuit 140 drives the power transmission circuit 120 and starts wireless power transfer. The wireless power transfer does not have to be started immediately after the oscillation of the oscillation circuit 150 has stopped, and instead, it may be started after checking that the fluctuation in the frequency has stopped as a result of, for example, a user placing the power reception apparatus 200 on the power transmission apparatus 100.

If it is determined in step S605 that the coupling coefficient k does not exceed the predetermined first threshold, it is necessary to determine whether the positional adjustment is still in progress or the power reception apparatus 200 has separated from the power transmission apparatus 100. The process then proceeds to step S607 to determine whether or not the coupling coefficient k is lower than a predetermined second threshold. If the predetermined first threshold is set to be 0.4, the predetermined second threshold may be set to be 0.01. However, the predetermined first and second thresholds are not restricted to these values and may be set as desired. If it is determined in step S607 that the coupling coefficient k is not lower than the predetermined second threshold, it means that the positional adjustment is still in progress. Thus, the process returns to step S600 and the positional adjustment is restarted. If it is determined in step S607 that the coupling coefficient k is lower than the predetermined second threshold, it is determined that the power reception apparatus 200 has separated from the power transmission apparatus 100. Then, the oscillation of the oscillation circuit 150 is stopped, and the positional adjustment mode is terminated.

There may be a special case in which the user has stopped the positional adjustment while the coupling coefficient k does not exceed the predetermined first threshold and is not lower than the predetermined second threshold. In this case, the process loops in steps S600 through S605 and S607 endlessly. Thus, exceptional handling may be added to the flowchart. In this exceptional handling, the number of times the process loops is counted, and if the counted number exceeds a predetermined number, the positional adjustment is terminated by stopping the oscillation of the oscillation circuit 150. In this manner, the above-described infinite loop is avoided.

In step S604, the coupling coefficient k is calculated by using expression (2). However, the coupling coefficient k may be calculated by using expression (5). Alternatively, the coupling coefficient k may be calculated by using a modified expression of expression (2) or (5).

By performing the above-described operation, the position detection device of the power transmission apparatus 100 of the first embodiment is able to detect that the power reception coil L2 of the power reception apparatus 200 is approaching the power transmission coil L1 of the power transmission apparatus 100 and to output information indicating that the power reception coil L2 is approaching. This enables the user to know that the power reception apparatus 200 has reached a suitable position. In this manner, positional adjustment can be performed easily.

Figure 7:
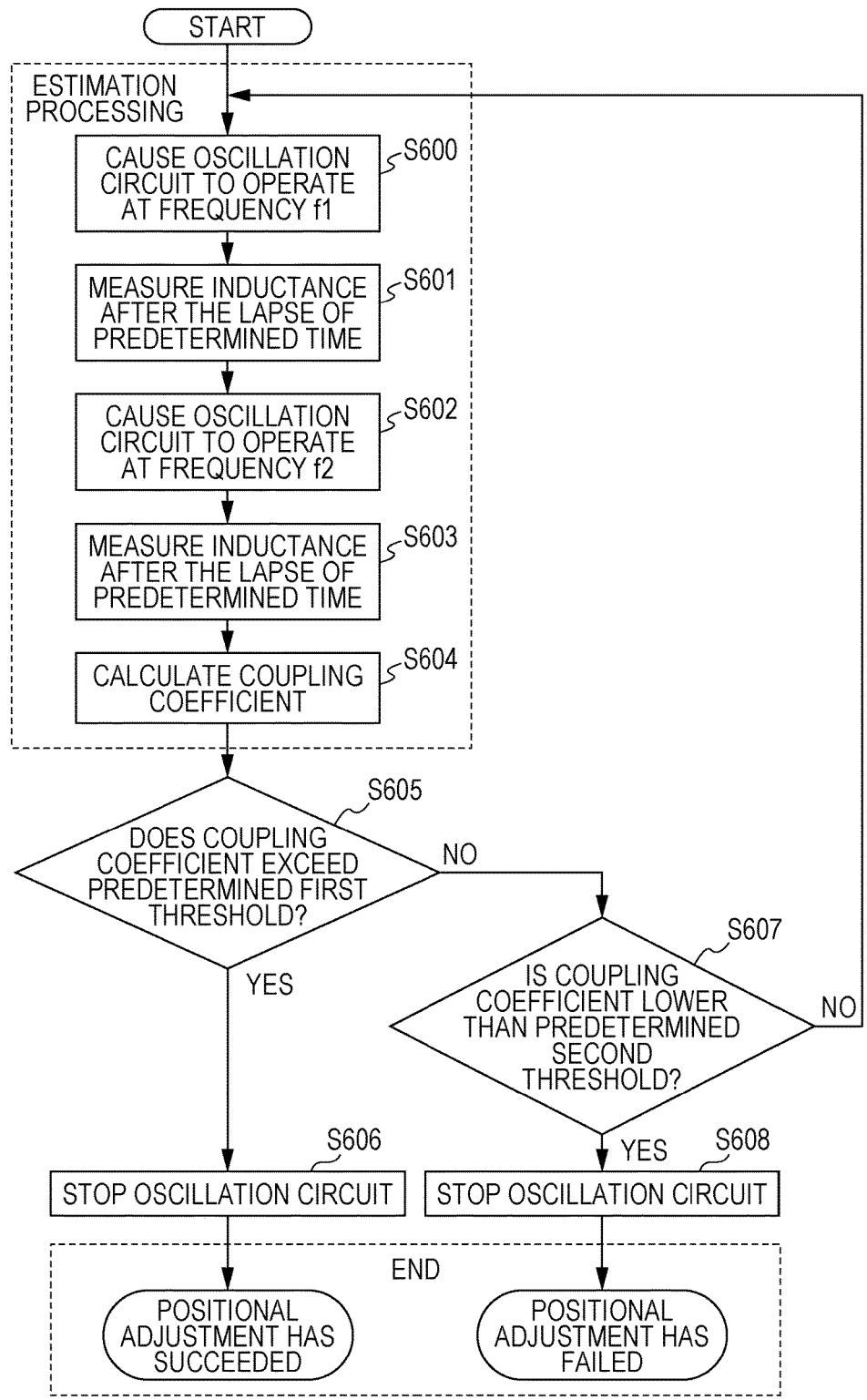
FIG. 7 is a flowchart illustrating a positional adjustment operation of a wireless power transmission apparatus according to the first embodiment of the present disclosure.

The operation of the wireless power transfer system of the first embodiment is not restricted to the operation in the flowchart of FIG. 7. For example, in step S605, instead of detecting that the power reception coil L has sufficiently approached by determining whether or not the coupling coefficient k exceeds the predetermined first threshold in terms of an absolute amount, it may be detected by determining whether or not a temporal change in the coupling coefficient k has been sufficiently reduced. Additionally, a plurality of thresholds may be provided, and, in accordance with the level of the coupling coefficient k, information indicating how close the power reception coil L2 is approaching the power transmission coil L1 in a stepwise manner may be output to the display element 170 or 270.

Second Embodiment

Figure 8:
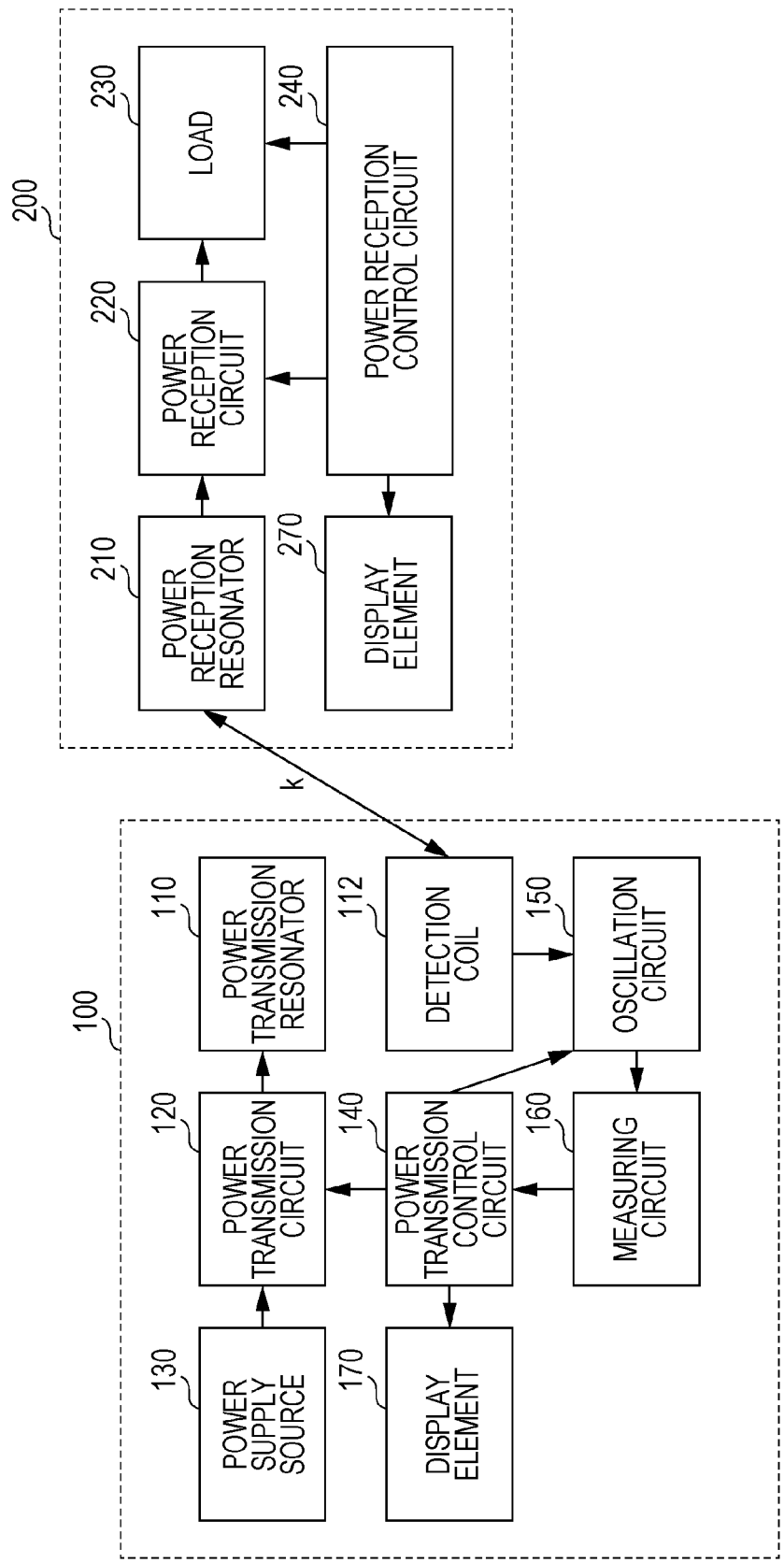
FIG. 8 is a block diagram illustrating the schematic configuration of a wireless power transfer system according to a second embodiment of the present disclosure.

FIG. 8 is a block diagram illustrating the schematic configuration of a wireless power transfer system according to a second embodiment of the present disclosure.

The basic configuration of the second embodiment is similar to that of the first embodiment. However, the configuration of the second embodiment is different from that of the first embodiment in that a detection coil 112 used for positional adjustment is disposed separately from the power transmission coil L1 included in the power transmission resonator 110. By providing the detection coil 112 for positional adjustment separately, the need to provide a switch between the power transmission resonator 110 and the oscillation circuit 150 is eliminated. Additionally, the detection coil 112 and the power transmission coil L1 may be disposed at different positions, thereby increasing the flexibility in designing the power transmission apparatus 100.

If the power reception apparatus 200 is moving during power transmission, that is, if the power reception coil L2 is also moving (for example, the power reception apparatus 200 is a vehicle in motion that is being charged from an in-vehicle charger or a self-propelled robot), a temporal change in the coupling coefficient can be measured in real time while power is being transmitted. Based on the measurement results, for example, in accordance with the temporal change in the coupling coefficient, the power transmission frequency may be changed to the optimal value or power transmission may be terminated safely. This makes it possible to enhance the safety of the wireless power transfer system and also to enhance the power transfer efficiency.

In the second embodiment, instead of the power transmission resonator 110, the detection coil 112 serves as the first resonator. Accordingly, the measuring circuit 160 measures the input inductance value Lin(f1) of the detection coil 112 when the oscillation circuit 150 oscillates at the first frequency f1 and measures the input inductance value Lin(f2) of the detection coil 112 when the oscillation circuit 150 oscillates at the second frequency f2. Then, based on these detection values, the relative position of the power reception resonator 210 to the detection coil 112 is detected. Since the positional relationship of the detection coil 112 to the power transmission resonator 110 of the power transmission apparatus 100 is known, if the relative position of the power reception resonator 210 to the detection coil 112 is detected, the relative position of the power reception resonator 210 to the power transmission resonator 110 is also detected. Typically, the detection coil 112 is disposed close to the power transmission resonator 110. Accordingly, when positional adjustment is performed so that the power reception resonator 210 will be positioned close enough to the detection coil 112, the distance between the power reception resonator 210 and the power transmission resonator 110 is also sufficiently decreased, thereby making it possible to efficiently perform wireless power transfer.

Third Embodiment

Figure 9:
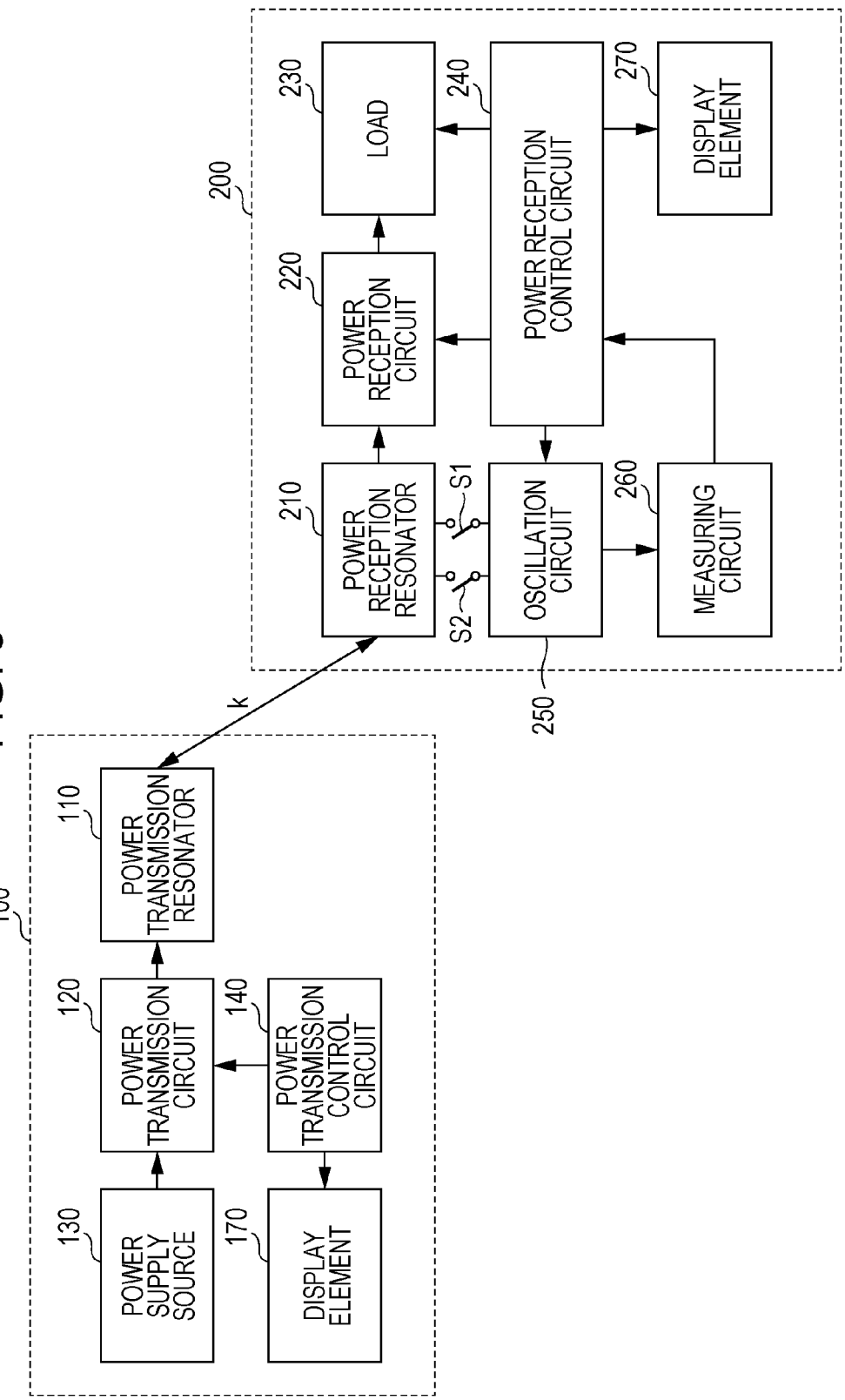
FIG. 9 is a block diagram illustrating the schematic configuration of a wireless power transfer system according to a third embodiment of the present disclosure.

FIG. 9 is a block diagram illustrating the schematic configuration of a wireless power transfer system according to a third embodiment of the present disclosure.

The basic configuration of the third embodiment is similar to that of the first embodiment. However, the configuration of the third embodiment is different from that of the first embodiment in the following point. Instead of the configuration shown in FIG. 1, by applying the configuration shown in FIG. 3 to the third embodiment, an oscillation circuit 250 and a measuring circuit 260 used for positional adjustment are disposed in the power reception apparatus 200, and the power transmission resonator 110 includes a parallel capacitor and oscillates at the resonant frequency fr.

There may be a case in which the power reception apparatus 200 is larger than the power transmission apparatus 100, for example, a case in which a large power reception apparatus 200, such as a tablet terminal, is charged from a small power transmission apparatus 100. In this case, if the power transmission apparatus 100 includes the display element 170 for positional adjustment, the display element 170 is hidden by the power reception apparatus 200, so that it is difficult to check whether or not correct positional adjustment is being performed. In this manner, if the power transmission apparatus 100 includes the display element 170, the usability when performing positional adjustment by a user may be impaired.

In the wireless power transfer system of the third embodiment, in the positional adjustment mode, the measuring circuit 260 of the power reception apparatus 200 measures the frequency of the power reception resonator 210 when the oscillation circuit 250 of the power reception apparatus 200 oscillates at the frequency f1 and also measures the frequency of the power reception resonator 210 when the oscillation circuit 250 oscillates at the frequency f2, thereby measuring the input impedance of the power reception resonator 210. That is, when the power transmission resonator 110 and the power reception resonator 210 are electromagnetically coupled to each other, that is, when the power transmission apparatus 100 is operated in the positional adjustment mode, the power reception resonator 210 of the power reception apparatus 200 is also able to observe the oscillation waveforms corresponding to the frequency f1 and the frequency f2. From the ratio of the oscillation frequency f1 to the oscillation frequency f2 obtained as a result of measuring the oscillation waveforms, the coupling coefficient k can be calculated or estimated by using expression (5). In order to implement expression (5), a known self-excited oscillation circuit based on the LC resonance principle is used as the oscillation circuit 250 of the third embodiment. If the wireless power transfer system of the third embodiment is a system in which the circuit reversibility holds true, the coupling coefficient estimated by the power transmission resonator 110 is the same as that by the power reception resonator 210. That is, the coupling coefficient indicates the same value as that estimated in the first or second embodiment.

In the third embodiment, by changing the display content on the display element 270 of the power reception apparatus 200 in accordance with a change in the coupling coefficient k between the power transmission coil L1 and the power reception coil L2, the user can be informed whether or not correct positional adjustment is being performed. The application of the configuration of the third embodiment is not restricted to the use of a case in which the power reception apparatus 200 is larger than the power transmission apparatus 100. If the power reception apparatus 200 includes the oscillation circuit 250, the configuration of the third embodiment is easily implemented.

Fourth Embodiment

Figure 10:
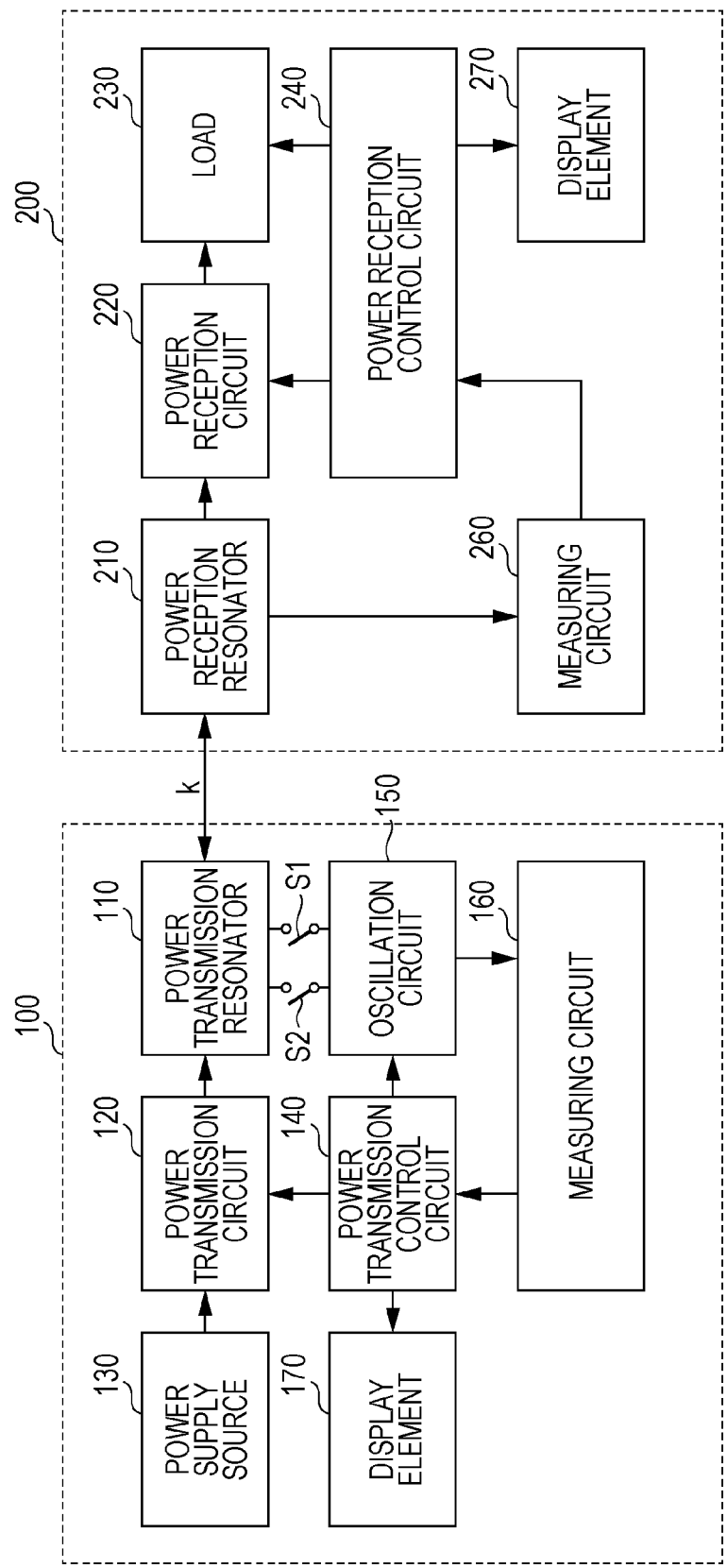
FIG. 10 is a block diagram illustrating the schematic configuration of a wireless power transfer system according to a fourth embodiment of the present disclosure.

FIG. 10 is a block diagram illustrating the schematic configuration of a wireless power transfer system according to a fourth embodiment of the present disclosure. The basic configuration of the fourth embodiment is similar to that of the third embodiment. However, the configuration of the fourth embodiment is different from that of the third embodiment in that the oscillation circuit 150 and the measuring circuit 160 for positional adjustment are also disposed in the power transmission apparatus 100 and in that the oscillation circuit 250 is not disposed in the power reception apparatus 200.

In a manner similar to the third embodiment, it is possible to implement, by the use of the display element 270 of the power reception apparatus 200, the function of informing a user of the current degree of the positional adjustment according to the coupling coefficient k calculated or estimated by the power reception apparatus 200 by using the measuring circuit 260. With the configuration of the fourth embodiment, the degree of the positional adjustment may be detected by both of the power transmission apparatus 100 and the power reception apparatus 200. Additionally, since the provision of the oscillation circuit 150 is not necessary in the power reception apparatus 200, the power reception apparatus 200 can be formed thinner.

In the third and fourth embodiments, a power reception coil and a detection coil may be provided separately in a manner similar to the second embodiment.

Fifth Embodiment

Figure 11A:
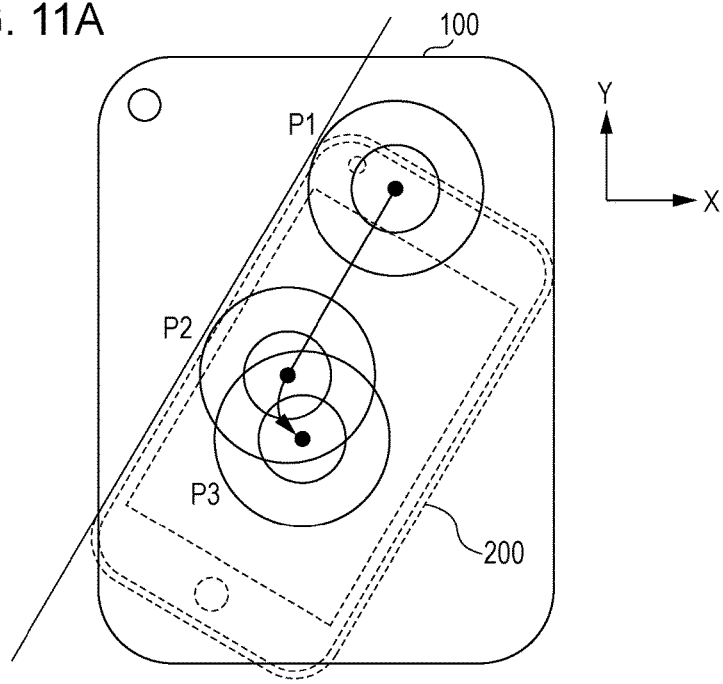
FIG. 11A illustrates a wireless power transfer system according to a fifth embodiment of the present disclosure.

FIG. 11A illustrates a wireless power transfer system according to a fifth embodiment of the present disclosure. In the fifth embodiment, the power transmission apparatus 100 is a wireless charger (power transmission stand), and the power reception apparatus 200 is a mobile terminal, such as a smartphone or a tablet terminal. In the fifth embodiment, the power transmission apparatus 100 includes a moving mechanism for moving the power transmission coil L1 and a movement control circuit for controlling the moving mechanism. Except for these points, the configuration of the fifth embodiment is similar to that of the first embodiment. The movement control circuit may be integrated into the power transmission control circuit 140. A description will be given below, assuming that the function of the movement control circuit is integrated in the power transmission control circuit 140.

In the fifth embodiment, upon detecting that the mobile terminal (power reception apparatus 200) is placed on the power transmission stand (power transmission apparatus 100), the power transmission control circuit 140 causes the moving mechanism to move the power transmission coil L1, for example, from an initial position P1 to a target position P3. The initial direction of this movement may be the X direction or the Y direction shown in FIG. 11A, or may be another direction.

Figure 11B:
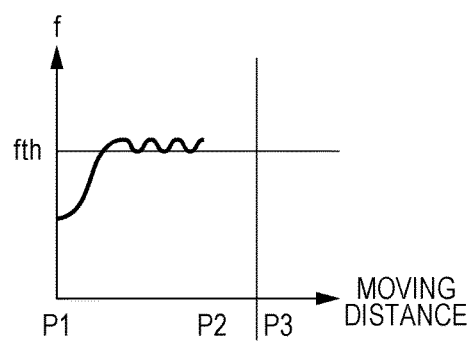
FIGS. 11B and 11C are graphs for explaining the operation of the wireless power transfer system of the fifth embodiment.

While the power transmission coil L1 is moving, the power transmission control circuit 140 continues oscillation of the oscillation circuit 150, and the measuring circuit 160 continuously estimates the coupling coefficient k on the basis of expression (2) or (5) or a modified expression of expression (2) or (5). When the power transmission coil L1 is approaching the power reception coil L2 within the mobile terminal, the oscillation frequency is increasing, as shown in FIG. 11B, due to the influence of a metal (such as a ground electrode or an antenna on a substrate) within the mobile terminal. When the oscillation frequency is increasing and exceeds a threshold fth, the power transmission coil L1 is continuously moving so that the oscillation frequency will not be lower than the threshold fth, thereby causing the power transmission coil L1 to approach the power reception coil L2. For performing this control, a known control technique, such as a proportional-integral-derivative (PID) controller, may be employed.

Figure 11C:
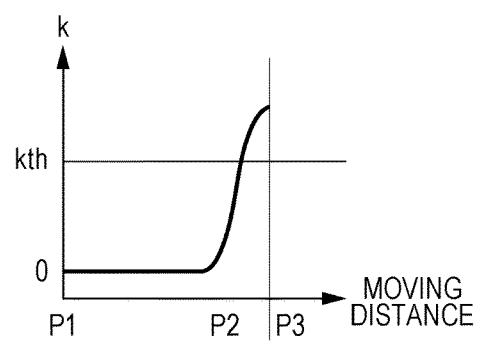

In the example shown in FIG. 11A, when the power transmission coil L1 has moved to the position P2, the coupling coefficient k starts to increase, as shown in FIG. 11C. When the measuring circuit 160 detects that the coupling coefficient k has started to increase, the power transmission control circuit 140 changes the parameters of the PID controller, and searches for the center of the target position P3 of the power reception coil L2 so that the coupling coefficient k will exceed a threshold kth. Upon detecting that the amount by which the coupling coefficient k changes is reduced to be substantially zero (that is, the coupling coefficient k has reached the maximal value) after the coupling coefficient k has exceeded the threshold kth, the power transmission control circuit 140 stops moving the power transmission coil L1 and starts power transmission.

Figure 12A:
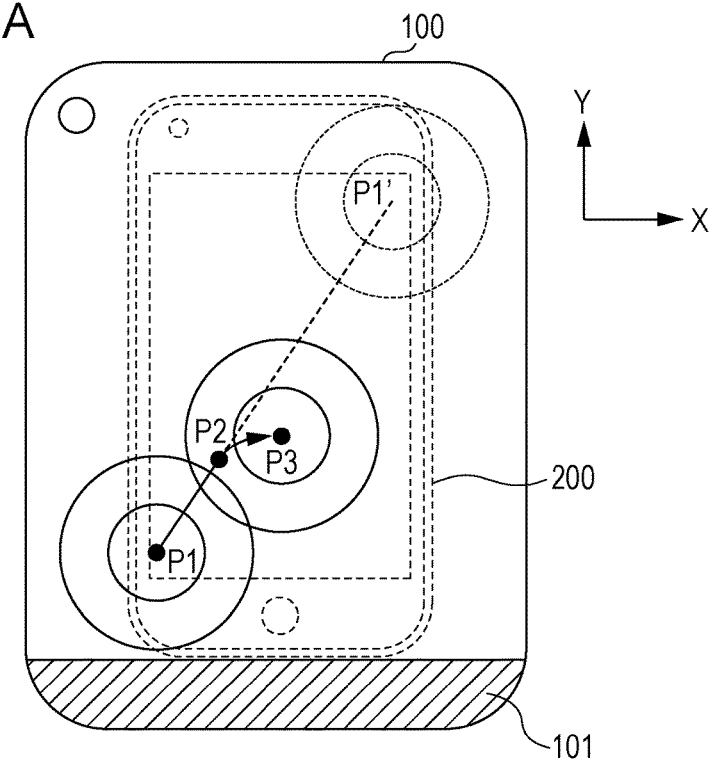
FIGS. 12A and 12B are a plan view and a right side view, respectively, of a modified example of the wireless power transfer system of the fifth embodiment.
Figure 12B:
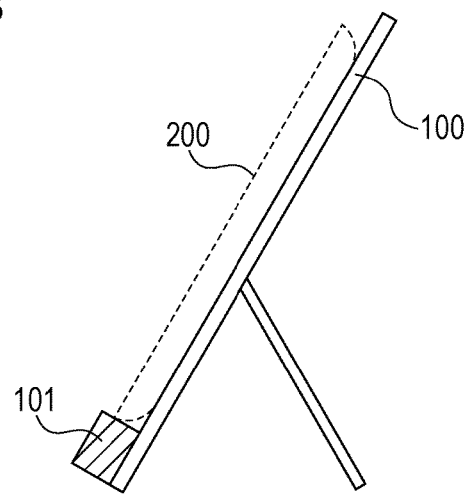

In the fifth embodiment, instead of the configuration shown in FIG. 11A, the configuration shown in FIGS. 12A and 12B may be employed. FIG. 12A is a plan view illustrating a state in which a power transmission stand (power transmission apparatus 100) is charging a terminal (power reception apparatus 200). FIG. 12B is a right side view of the power transmission stand and the terminal shown in FIG. 12A. In this modified example, the power transmission stand includes a projecting portion 101 for supporting the terminal to make it easy to perform positional adjustment. When the terminal is placed on the power transmission stand, the angle of the terminal placed on the power transmission stand is fixed by the projecting portion 101, thereby making it easier to search for the target position P3 than the configuration shown in FIG. 11A.

In this modified example, upon detecting that the terminal is placed on the power transmission stand, the power transmission control circuit 140 causes the moving mechanism to move the power transmission coil L1 from the initial position P1 to the target position P3. The initial direction of this movement may be set to be an oblique direction from the initial position P1 to a position P1'.

Thereafter, the operation is similar to that of the fifth embodiment discussed with reference to FIGS. 11B and 11C. While the power transmission coil L1 is moving, the power transmission control circuit 140 continues oscillation of the oscillation circuit 150, and the measuring circuit 160 continuously estimates the coupling coefficient k. When the power transmission coil L1 is approaching the power reception coil L2 within the terminal, the oscillation frequency is increasing, as shown in FIG. 11B, due to the influence of a metal (such as a ground electrode or an antenna on a substrate) within the terminal. When the oscillation frequency is increasing and exceeds the threshold fth, the power transmission coil L1 is continuously moved so that the oscillation frequency will not be lower than the threshold fth, thereby causing the power transmission coil L1 to approach the power reception coil L2. For performing this control, a known control technique, such as a PID controller, may be employed.

When the power transmission coil L1 has moved to the position P2, the coupling coefficient k starts to increase, as shown in FIG. 11C. When the measuring circuit 160 detects that the coupling coefficient k has started to increase, the power transmission control circuit 140 changes the parameters of the PID controller, and searches for the center of the target position P3 of the power reception coil L2 so that the coupling coefficient k will exceed a threshold kth. Upon detecting that the amount by which the coupling coefficient k changes is reduced to be substantially zero (that is, the coupling coefficient k has reached the maximal value) after the coupling coefficient k has exceeded the threshold kth, the power transmission control circuit 140 stops moving the power transmission coil L1 and starts power transmission.

As discussed above, in the fifth embodiment, the power transmission coil L1 is first moved so that the oscillation frequency will not be lower than the threshold fth, thereby causing the power transmission coil L1 to approach the power reception coil L2. Then, the position of the power transmission coil L1 at which the coupling coefficient k takes the maximal value is searched for, on the basis of expression (2) or (5) or a modified expression of expression (2) or (5). With this operation, it is possible to automatically move the power transmission coil L1 close to the power reception coil L2, regardless of the position and the orientation of the terminal.

Another Embodiment

In the first through fifth embodiments, the position detection device is able to operate, for example, in several microampere to several milliampere. Accordingly, the position detection operation can be performed by using a low-power-operated circuit. On the other hand, when wireless power transfer is performed, several watts to several kilowatts power, for example, is transmitted from the power transmission resonator 110 to the power reception resonator 210. It is now assumed that the power reception coil L2 is accidentally displaced while power transfer is being performed. At this time, if the power transfer mode is shifted to the positional adjustment mode, energy stored in the power transmission coil L1 during the power transfer mode may flow to a positional adjustment circuit (position detection circuit) in excess of the withstand voltage of the positional adjustment circuit, which may burn the positional adjustment circuit.

Accordingly, in this embodiment, after energy stored in the power transmission coil L1 during the wireless power transfer mode is released to a ground, the wireless power transfer mode is shifted to the positional adjustment mode. This makes it possible to prevent the burning of the positional adjustment circuit. This will be explained more specifically below. When switching the wireless power transfer mode to the positional adjustment mode, among inverters included in the power transmission circuit 120, a MOSFET switch connected to a ground is turned ON. For example, in the circuit configuration shown in FIG. 15, a switch Q4 connected to a ground and the power transmission coil L1 within the power transmission resonator 110 is turned ON. This makes it possible to release energy stored in the power transmission coil L1 within the power transmission resonator 110 to a ground. Then, after the lapse of a predetermined time, the positional adjustment mode is started. This operation may be performed in any of the first through fifth embodiments.

The coupling coefficient estimating method discussed in the embodiments of the present disclosure is not restricted to a case in which wireless power transfer is implemented by the electromagnetic induction method or the magnetic-field resonance method, and it may be applicable to another power transfer method. For example, in the electric-field coupling method for performing power transfer by using a pair of electrodes instead of a pair of coils (International Publication No. 2007/107642 pamphlet), the coupling coefficient between the electrodes may be calculated by expression (6).

$$Cin(f)=C1\{1-k^2/(1-(fr/f)^2)\} \quad (6)$$

In expression (6), Cin(f) is the input capacitance value that may be measured for the electrode of the power transmission resonator, C1 is the capacitance value of the power transmission electrode, and fr is the resonant frequency of a parallel resonance circuit which is formed by adding a parallel inductor to the electrode of the power reception resonator. In this embodiment, the coupling coefficient may be estimated from the measurement results of the input capacitance values corresponding to two frequencies, as in expression (2) or (5). As a device for measuring the input capacitance values, a self-excited oscillation circuit may be used, as stated above.

First Example

Figure 13A:
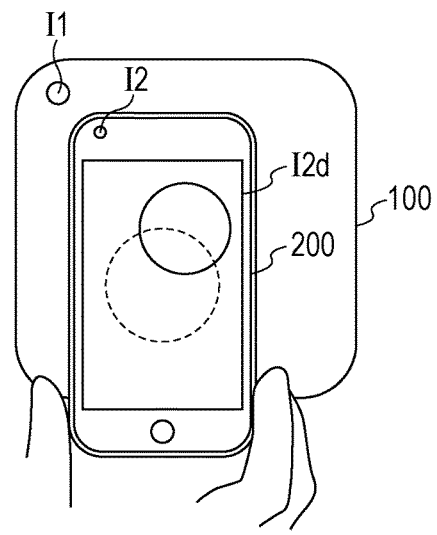
FIGS. 13A through 13C illustrate a first example of the wireless power transfer system of any one of the first through third embodiments.
Figure 13B:
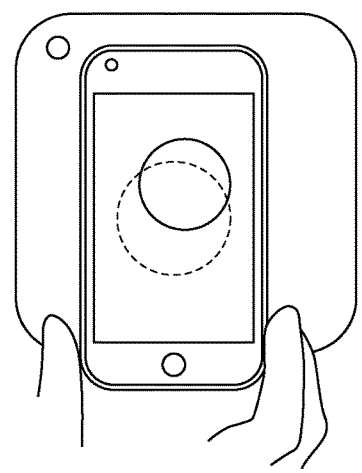
Figure 13C:
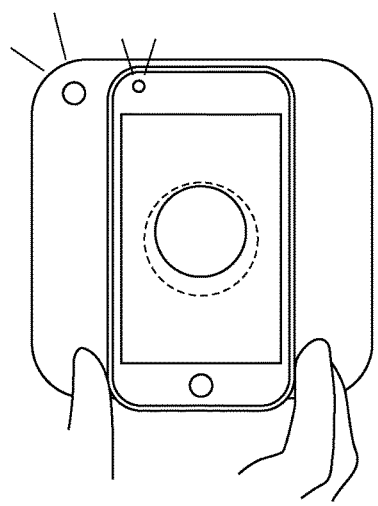

FIGS. 13A through 13C illustrate a first example of the wireless power transfer system of any one of the first through third embodiments, and more specifically, illustrate examples of the power transmission apparatus 100 and the power reception apparatus 200. In the first example, the power transmission apparatus 100 is a charger placed on a desk, and the power reception apparatus 200 is a mobile terminal, such as a smartphone or a tablet terminal. The power transmission apparatus 100 includes an indicator I1, and the power reception apparatus 200 includes indicators I2 and I2d. The indicators I1 and I2 are examples of the display elements 170 and 270. The indicator I2d is a display as an example of a set of a plurality of light sources. FIG. 13A illustrates a state in which the positional adjustment between the power transmission apparatus 100 (charger) and the power reception apparatus 200 (mobile terminal) has just started. FIG. 13B illustrates a state in which the positional adjustment is being performed by making the power reception resonator 210 approach the power transmission resonator 110 as a result of moving the power reception apparatus 200 close to the power transmission apparatus 100. FIG. 13C illustrates a state in which the positional adjustment has been completed.

In accordance with a change in the coupling coefficient as a result of causing the power reception coil L2 to approach the power transmission coil L1, the states of the indicator I1 or the indicators I2 and I2d are continuously changed so that a user can be informed of the level of positional adjustment. For example, in accordance with the degree of positional adjustment between the power transmission resonator 110 and the power reception resonator 210, the brightness of the indicator I1 or I2 may be increased or decreased, and the degree of positional adjustment may be indicated in real time by a numeric value or graphics. With this arrangement, the positional adjustment performed by the user can be supported intuitively by the power transmission apparatus 100 or the power reception apparatus 200.

If the power reception apparatus 200 does not include the indicator I2, information indicating the level of positional adjustment may be displayed on a display of the power reception apparatus 200.

Second Example

Figure 14A:
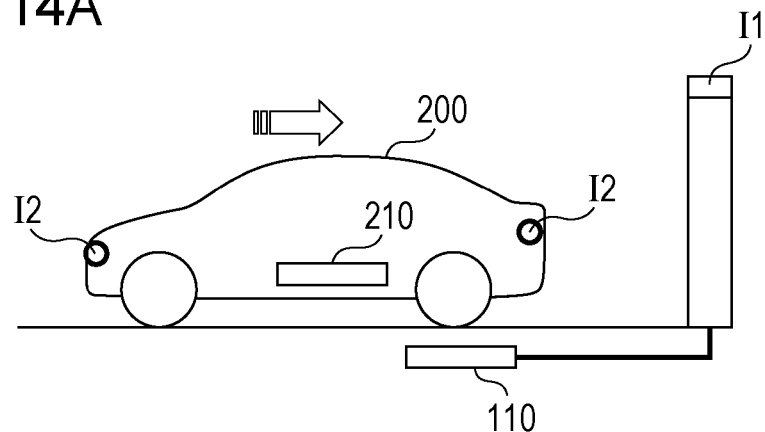
FIGS. 14A through 14C illustrate a second example of the wireless power transfer system of any one of the first through third embodiments.
Figure 14B:
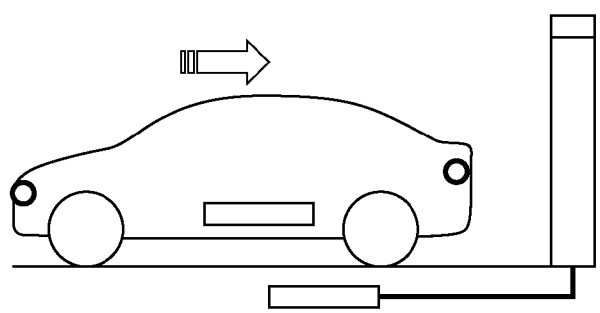
Figure 14C:
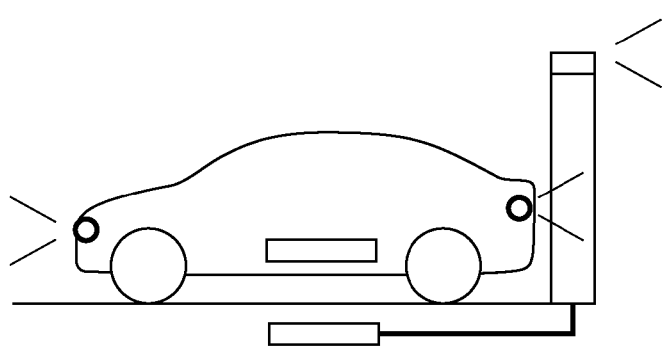

FIGS. 14A through 14C illustrate a second example of the wireless power transfer system of any one of the first through third embodiments, and more specifically, illustrates examples of the power transmission apparatus 100 and the power reception apparatus 200. In the second example, the power transmission apparatus 100 is a charger including a power transmission coil embedded in a road, and the power reception apparatus 200 is an electric vehicle including a power reception coil. FIG. 14A illustrates a state in which the positional adjustment between the power transmission apparatus 100 and the power reception apparatus 200 has just started. FIG. 14B illustrates a state in which the positional adjustment is being performed by making the power reception resonator 210 approach the power transmission resonator 110 as a result of backing the electric vehicle. FIG. 14C illustrates a state in which the positional adjustment has been completed.

In the second example, as well as in the first example, the positional adjustment can be supported by indicating on the indicators I1 and I2 whether or not the positional adjustment is being correctly performed. In the second example, upon detecting that the power reception resonator 210 is displaced from the power transmission resonator 110 on the basis of the estimated coupling coefficient k, the driving system of the electric vehicle may automatically shift the power reception apparatus 200 to the optimal position. This automatic positional adjustment may be performed as a result of the power transmission apparatus 100 moving the power transmission resonator 110 close to the power reception resonator 210. In this case, the power transmission apparatus 100 includes a driving mechanism for moving the power transmission resonator 110 in accordance with the output from the position detection device.

(Example of Circuit Configuration)

Figure 15:
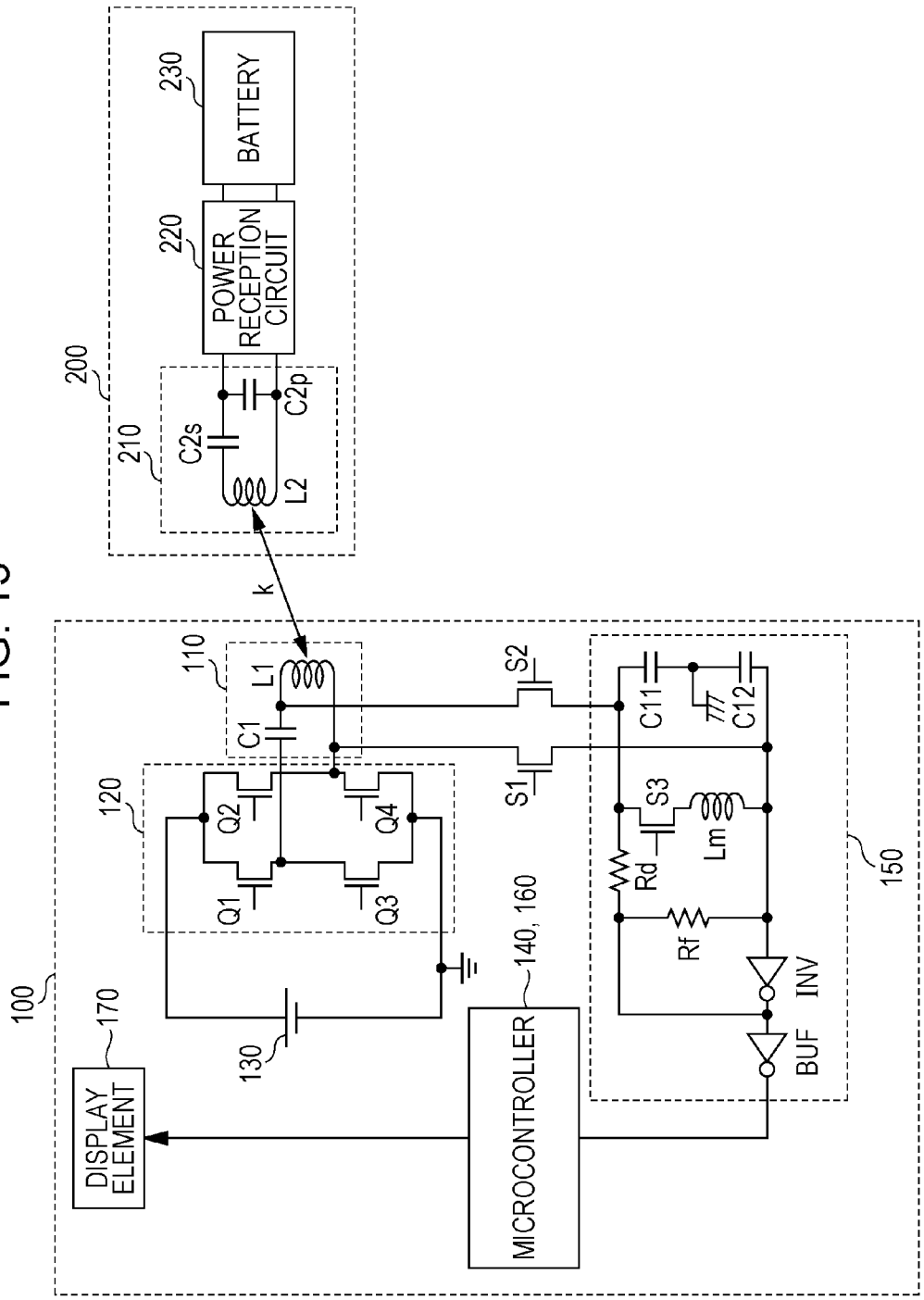
FIG. 15 is a circuit diagram illustrating an example of the circuit configuration of the wireless power transfer system of the first embodiment.

FIG. 15 is a diagram illustrating an example of the circuit configuration of the wireless power transfer system of the first embodiment.

The power transmission resonator 110 includes a power transmission coil L1 and a capacitor C1 connected in series with the power transmission coil L1. The power reception resonator 210 includes a power reception coil L2, a capacitor C2p connected in parallel with the power reception coil L2, and a capacitor C2s connected in series with the power reception coil L2.

In this example, the outer dimension of the power transmission coil L1 is 39 mm, and the inductance L1 is set to be 13.6 µH. The outer dimension of the power reception coil L2 is 34 mm, and the inductance L2 is set to be 15.8 µH. The capacitance of the series capacitor C1 is set to be 180 nF, and the capacitance of the series capacitor C2s and that of the parallel capacitor C2p are set to be 120 nF and 1590 pF, respectively. The power transmission coil L1 oscillates at 100 kHz, and the power reception coil L2 oscillates at 115 kHz and 1000 kHz.

The power transmission coil L1 is connected to the oscillation circuit 150 via switches S1 and S2. The oscillation circuit 150 in this example is a Pierce oscillator, which serves as a self-excited LC oscillation circuit. Resistors Rf and Rd are elements for adjusting the excitation level of the oscillation circuit 150. The oscillation circuit 150 also includes a switch S3 and an adjusting inductor Lm for changing the oscillation frequency. The inductance of the adjusting inductor Lm and the capacitance values of capacitors C11 and C12 are determined so that the oscillation circuit 150 will oscillate at two frequencies (f1=400 kHz and f2=1500 kHz), which are different from the resonant frequency fr (fr=115 kHz, fr=1000 kHz) of the power reception coil L2. The oscillation circuit 150 oscillates at the frequency f1 by turning ON the switches S1 and S2 and by turning OFF the switch S3. The oscillation circuit 150 oscillates at the frequency f2 by turning ON the switches S1 and S2 and by turning ON the switch S3. The capacitors C1 and C2s appear to short-circuit at the frequencies f1 and f2, and the capacitor C2p appears to be opened at the frequency f1 and to short-circuit at the frequency f2. Thus, the main capacitor that may be used for estimating the coupling coefficient k seems to be the capacitor C2p. In this example, expression (7) obtained by modifying expression (5) is used for estimating the coupling coefficient k.

$$k^2 \approx 1 - f1^2/(f2^2 - f3^2) \tag{7}$$

The oscillation frequency f3 is a frequency when the switches S1 and S2 are turned OFF and the switch S3 is turned ON. That is, measuring of the frequency f3 is equivalent to measuring of the inductance of the adjusting inductor Lm. When the power transmission coil L1 oscillates at the frequency f2, the oscillation frequency includes a component based on the input inductance of the power transmission coil L1 and a component based on the inductance of the adjusting inductor Lm. Accordingly, in expression (7), a component based on the inductance of the adjusting inductor Lm is removed in the denominator of the second term, and then, the coupling coefficient is calculated. In this manner, expression (7) obtained by modifying expression (5) may be used for calculating the coupling coefficient k, and then, the measuring circuit 160 may detect the relative position of the power reception resonator 210 (second resonator) to the power transmission resonator 110 (first resonator) on the basis of the coupling coefficient k. As stated above, there are various kinds of circuit topologies for the self-excited LC oscillation circuit, and thus, an expression obtained by modifying expression (5) is not restricted to expression (7). Even by the use of a different circuit topology, it is easy for those skilled in the art to derive a modified expression from expression (5). Similarly, if expression (2) is used, the coupling coefficient k may be calculated by using an expression obtained by modifying expression (2) in accordance with the circuit topology.

Figure 16:
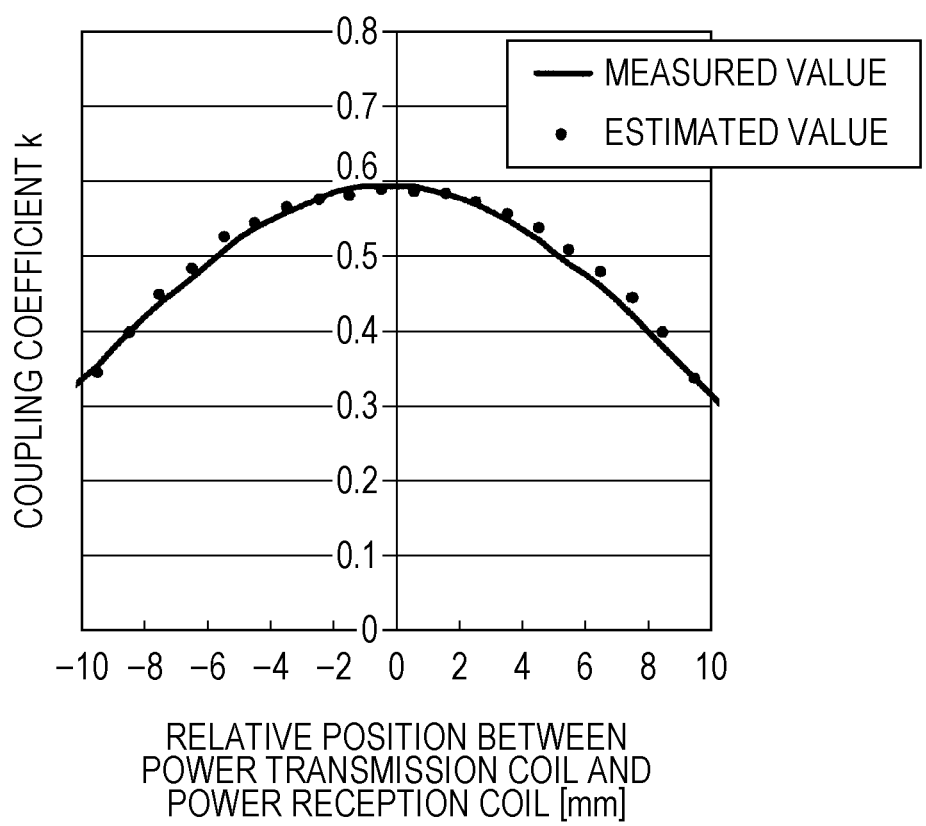
FIG. 16 is a graph illustrating measurement results and estimation results of the coupling coefficient obtained by a position detection device shown in FIG. 15.

The measurement results of the coupling coefficient k obtained by using a network analyzer and the estimation results of the coupling coefficient k obtained by the position detection device shown in FIG. 15 are shown in FIG. 16.

Upon comparison of the measurement results with the estimation results, it is seen that the measured values substantially coincide with the estimated values. Thus, the effectiveness of the expressions for estimating the coupling coefficient used in the embodiments of the present disclosure can be validated. It is now assumed that a power transmission apparatus that can perform a safe, high-efficiency wireless power transfer operation when the coupling coefficient is, for example, 0.4 or higher, is designed. In this case, if the threshold for the coupling coefficient k is set to be 0.4 in step S605 of the flowchart of FIG. 7 so that the positional adjustment will succeed, it is possible to provide a power transmission apparatus (such as a charger) in which the relative positional displacement between the power transmission coil 110 and the power reception coil 210 is about ±8 mm.

According to a first aspect of the present disclosure, there is provided a power transmission apparatus for detecting a position of a power reception apparatus that includes a load and a second resonator which is constituted by a parallel resonance circuit having a second coil and a capacitor. The power transmission apparatus includes: a first coil; an oscillation circuit that oscillates alternating current power at a first frequency (f1) which is lower than a resonant frequency (fr) of the second resonator and at a second frequency (f2) which is higher than the resonant frequency (fr); and a measuring circuit that measures an inductance value of the first resonator when the first resonator and the second resonator are electromagnetically coupled to each other. The measuring circuit measures an input inductance value Lin(f1) of the first resonator when the oscillation circuit oscillates alternating current power at the first frequency (f1) and an input inductance value Lin(f2) of the first resonator when the oscillation circuit oscillates alternating current power at the second frequency (f2), and calculates a coupling coefficient k by using an expression represented by $k^2=1-\text{Lin}(f2)/\text{Lin}(f1)$, thereby detecting a relative position of the second resonator to the first resonator on the basis of the coupling coefficient k.

According to the first aspect, by disposing a capacitor at both ends of the second coil, a parallel resonance circuit including the second coil and the capacitor is provided in the power reception apparatus. With this arrangement, when the power reception apparatus is driven as a result of the oscillation circuit oscillating at the first frequency (f1) lower than the resonant frequency (fr) of the second resonator (power reception resonator), a current does not flow into the capacitor, thereby creating a state in which both ends of the second coil are substantially opened. On the other hand, when the power reception apparatus is driven as a result of the oscillation circuit oscillating at the second frequency (f2) higher than the resonant frequency (fr), a current flows into the capacitor, thereby creating a state in which both ends of the second coil short-circuit.

Accordingly, in order to measure the inductance value Lin(f1) of the first resonator (power transmission resonator) in the state in which both ends of the second coil are substantially opened, the oscillation circuit oscillates AC power at the first frequency (f1), and then, the inductance value Lin(f1) of the first resonator is measured. On the other hand, in order to measure the inductance value Lin(f2) of the first resonator in the state in which both ends of the second coil short-circuit, the oscillation circuit oscillates AC power at the second frequency (f2), and then, the inductance value Lin(f2) of the first resonator is measured. As a result, the coupling coefficient can be calculated from the measured inductance values Lin(f1) and Lin(f2) of the first resonator.

For example, in a wireless power transfer system disclosed in Japanese Unexamined Patent Application Publication No. 2009-118587, in order to calculate a coupling coefficient, it is necessary to provide, in a power reception apparatus, a short-circuiting switch for switching between a state in which both ends of a second coil are substantially opened and a state in which both ends of the second coil short-circuit and a first control circuit for controlling this short-circuiting switch. It is also necessary to provide a second control circuit for controlling the switching of the short-circuiting switch in a power transmission apparatus.

Thus, according to the first aspect of the present disclosure, by merely providing a capacitor at both ends of the second coil, it is possible to create a state in which both ends of the second coil are substantially opened and a state in which both ends of the second coil short-circuit. Thus, it is not necessary to provide the above-described short-circuiting switch and first control circuit in the power reception apparatus, nor does it necessary to send a signal from the power transmission apparatus to control the short-circuiting switch. As a result, since positional adjustment is performed by using the coupling coefficient, a power transmission apparatus is able to perform high-precision positional adjustment with a simple configuration and without increasing the cost even if a load is changed.

According to a second aspect of the present disclosure, in the power transmission apparatus according to the first aspect: a power transmission frequency, the first frequency (f1), and the second frequency (f2) may be set in the oscillation circuit; and the power transmission apparatus may further include a control circuit that causes the power transmission apparatus to wirelessly transmit power to the power reception apparatus by using the power transmission frequency and that causes the measuring circuit to detect the relative position of the second resonator to the first resonator by using the first frequency (f1) and the second frequency (f2).

According to the second aspect, by using the single oscillation circuit, power is wirelessly transmitted from the power transmission apparatus to the power reception apparatus by using the power transmission frequency, and AC power is transmitted by using the first frequency (f1) and the second frequency (f2). Thus, the number of components is decreased, and the cost is accordingly reduced.

According to a third aspect of the present disclosure, in the power transmission apparatus according to the first or second aspect, when the second coil short-circuits, the input inductance value corresponding to the first frequency (f1) and the input inductance value corresponding to the second frequency (f2) may substantially coincide with each other.

According to a fourth aspect of the present disclosure, in the power transmission apparatus according to one of the first through third aspects, after the lapse of a predetermined time after the oscillation circuit switches the first frequency (f1) to the second frequency (f2) or switches the second frequency (f2) to the first frequency (f1), the measuring circuit may start monitoring an amplitude of a voltage or a current of the oscillated alternating current power, and when the amplitude converges to a fixed width, the measuring circuit may measure the input inductance values.

Immediately after switching the oscillation frequency, a transient response occurs, and thus, the input inductance values are not stably measured. According to the fourth aspect, however, measurements are started after the lapse of a predetermined time, and thus, it is possible to measure the input inductance values with high precision.

According to a fifth aspect of the present disclosure, in the power transmission apparatus according to one of the first through fourth aspects, the power transmission apparatus further comprises a power transmission circuit that wirelessly transmits power from the power transmission apparatus to the power reception apparatus by using a power transmission frequency and a control circuit that controls the power transmission circuit to wirelessly transmit power from the power transmission apparatus to the power reception apparatus or that causes the measuring circuit to detect the relative position of the second resonator to the first resonator by using the first frequency (f1) and the second frequency (f2).

According to the fifth aspect, upon completion of the positional adjustment of the second resonator to the first resonator, power is wirelessly transmitted from the power transmission apparatus to the power reception apparatus. Accordingly, it is possible to transmit power from the power transmission apparatus to the power reception apparatus with high efficiency while ensuring the safety.

According to a sixth aspect of the present disclosure, in the power transmission apparatus according to one of the first through fifth aspects: the first resonator may include a power transmission coil used for wirelessly transmitting power; and a switch for switching electrical connection between the oscillation circuit and the power transmission coil may be disposed, and the electrical connection between the oscillation circuit and the power transmission coil may be disconnected by using the switch when power is wirelessly transmitted.

According to the sixth aspect, power used for performing wireless transmission is higher than AC power used for performing position detection. Thus, if there is a possibility that the oscillation circuit will be burnt while power is being transmitted, a switch may be provided between the power transmission resonator and the oscillation circuit so that they will be electrically disconnected from each other while power is being wirelessly transmitted, thereby preventing power used for wireless transmission from flowing into the oscillation circuit that performs position detection.

According to a seventh aspect of the present disclosure, in the power transmission apparatus according to one of the first through sixth aspects, a third resonator including a third coil used for wirelessly transmitting power from the power transmission apparatus to the power reception apparatus may be disposed separately from the first resonator.

According to the seventh aspect, the first resonator including the first coil (detection coil) for positional adjustment is separately provided. Thus, the first coil and the third coil (power transmission coil) may be disposed at different positions, thereby increasing the flexibility in designing the power transmission apparatus.

If the second coil (power reception coil) is moving during power transmission (for example, the power reception apparatus is a vehicle in motion which is being charged from an in-vehicle charger, or a self-propelled robot), a temporal change in the coupling coefficient can be measured in real time while power is being transmitted. Based on the measurement results, for example, in accordance with the temporal change in the coupling coefficient, the power transmission frequency may be changed to the optimal value and power transmission may be terminated safely. This makes it possible to enhance the safety of the wireless power transfer system and also to enhance the power transfer efficiency.

According to an eighth aspect of the present disclosure, in the power transmission apparatus according to one of the first through seventh aspects, after stopping wirelessly transmitting power, the control circuit may perform control so that energy stored in the first resonator will be released to a ground, and then may cause the measuring circuit to detect the relative position of the second resonator to the first resonator.

According to the eighth aspect, after energy stored in the first coil during the wireless power transfer mode is released to a ground, the wireless power transfer mode is shifted to the positional adjustment mode. This makes it possible to prevent the burning of a circuit used for positional adjustment.

According to a ninth aspect of the present disclosure, in the power transmission apparatus according to one of the first through eighth aspects, upon detecting that the relative position of the second resonator to the first resonator is a position at which the power transmission apparatus is able to wirelessly transmit power to the power reception apparatus, the control circuit may switch the first frequency (f1) and the second frequency (f2) to the power transmission frequency and may cause the power transmission apparatus to wirelessly transmit power to the power reception apparatus.

According to a tenth aspect of the present disclosure, the power transmission apparatus according to one of the first through ninth aspects may further include: a power transmission circuit that supplies power to the power transmission coil. The control circuit may control the power transmission circuit and the oscillation circuit, and may control the power transmission circuit in accordance with measurement results obtained by the measuring circuit so as to adjust a power transmission state.

According to the tenth aspect, based on the detection results obtained by the measuring circuit, for example, in accordance with the temporal change in the coupling coefficient, the power transmission frequency and the power transmission voltage may be changed to the optimal value and power transmission may be terminated safely. This makes it possible to enhance the safety of the wireless power transfer system and also to enhance the power transfer efficiency.

According to an eleventh aspect of the present disclosure, in the power transmission apparatus according to one of the first through tenth aspects, the control circuit may determine a power transmission frequency and a power transmission voltage in accordance with detection results obtained by the measurement circuit.

According to the eleventh aspect, based on the detection results obtained by the measuring circuit, for example, in accordance with the temporal change in the coupling coefficient, initial values of the power transmission frequency and the power transmission voltage may be changed to the optimal values and power transmission may be terminated safely. This makes it possible to enhance the safety of the wireless power transfer system and also to enhance the power transfer efficiency.

According to a twelfth aspect of the present disclosure, the power transmission apparatus according to one of the first through eleventh aspects may further include a display element. The control circuit may cause the display element to perform display when the coupling coefficient k exceeds a predetermined value.

According to the twelfth aspect, when the coupling coefficient k exceeds a predetermined value, it is determined that the power reception resonator is located at a suitable position (position at which the power reception apparatus can be charged) with respect to the position of the power transmission resonator. Then, the display element, such as a light source, a display, or a speaker, provided in the power transmission apparatus or the power reception apparatus performs display. With this arrangement, a detection result is supplied to a user as information in the form of light, video, or sound emitted from the display element. Then, the user can be informed that the power reception resonator is located at a suitable position (position at which the power reception apparatus can be charged) with respect to the position of the power transmission resonator. The display element is not restricted to an element presenting visual information, but also includes an element presenting only audio information (sound or voice).

According to a thirteenth aspect of the present disclosure, in the power transmission apparatus according to one of the first through twelfth aspects: the power reception apparatus may include a display unit, and when the coupling coefficient k exceeds a predetermined value, the control circuit may perform control so that the power reception apparatus will send a control command for causing the display unit to display information indicating that the power reception apparatus is located in an area where the power reception apparatus is able to receive power from the power transmission apparatus.

According to the thirteenth aspect, the display unit is disposed in the power reception apparatus. Generally, a power reception apparatus is disposed above a power transmission apparatus. Accordingly, the display element provided in the power transmission apparatus may be hidden by the power reception apparatus. Thus, by providing the display unit in the power reception apparatus located above the power transmission apparatus, it is possible to inform a user that the power reception resonator is located at a suitable position (position at which the power reception apparatus can be charged) with respect to the position of the power transmission resonator. The display unit may be a large display screen provided in, for example, a smartphone, or may be a display element.

According to a fourteenth aspect of the present disclosure, there is provided a power transmission apparatus for detecting a position of a power reception apparatus that includes a load and a second resonator which is constituted by a parallel resonance circuit having a second coil and a capacitor. The power transmission apparatus includes: a first resonator including a first coil; an oscillation circuit that oscillates alternating current power at a first frequency (f1) which is lower than a resonant frequency (fr) of the second resonator and at a second frequency (f2) which is higher than the resonant frequency (fr); and a measuring circuit that measures an inductance value of the first resonator when the first resonator and the second resonator are electromagnetically coupled to each other. When a first inductance value corresponding to the first frequency (f1) is inversely proportional to the square of the first frequency (f1) and when a second inductance value corresponding to the second frequency (f2) is inversely proportional to the square of the second frequency (f2), the measuring circuit calculates a coupling coefficient k by using an expression represented by $k^2=1-f1^2/f2^2$, thereby detecting a relative position of the second resonator to the first resonator on the basis of the coupling coefficient k.

According to the fourteenth aspect, if the oscillation circuit is a self-excited oscillation circuit based on the LC resonance principle, when the input inductance value is indicated by L and the capacitance is indicated by C, the frequency f of the self-excited oscillation circuit may be represented by an expression of $f=1/(2\pi \times (LC)^{(1/2)})$. Since the capacitance C is a circuit constant and is accordingly known, the input inductance value L is inversely proportional to the square of the frequency of the oscillation circuit. Thus, the expression $k^2=1-Lin(f2)/Lin(f1)$ for calculating the coupling coefficient may be modified into $k^2=1-f1^2/f2^2$. Accordingly, instead of measuring the input inductance values by using the measuring circuit, the frequencies (f1) and (f2) at which the oscillation circuit oscillates may be used for calculating the coupling coefficient. Thus, since it is not necessary to measure the input inductance values in the measuring circuit, fast calculation of the coupling coefficient is implemented. The values of the first frequency (f1) and the second frequency (f2) may be obtained as a result of the measuring circuit measuring the frequency (f1) and the second frequency (f2) of the first resonator. The above-described concept may be applicable to another type of oscillation circuit, and it is easy for those skilled in the art to derive a modified expression.

According to a fifteenth aspect of the present disclosure, in the power transmission apparatus according to the fourteenth aspect: a power transmission frequency, the first frequency (f1), and the second frequency (f2) may be set in the oscillation circuit; and the power transmission apparatus may further include a control circuit that causes the power transmission apparatus to wirelessly transmit power to the power reception apparatus by using the power transmission frequency and that causes the measuring circuit to detect the relative position of the second resonator to the first resonator by using the first frequency (f1) and the second frequency (f2).

According to the fifteenth aspect, by using the single oscillation circuit, power is wirelessly transmitted from the power transmission apparatus to the power reception apparatus by using the power transmission frequency, and AC power is transmitted by using the first frequency (f1) and the second frequency (f2). Thus, the number of components is decreased, and the cost is accordingly reduced.

According to a sixteenth aspect of the present disclosure, in the power transmission apparatus according to the fourteenth or fifteenth aspect, when the second coil short-circuits, the input inductance value corresponding to the first frequency (f1) and the input inductance value corresponding to the second frequency (f2) may substantially coincide with each other.

According to a seventeenth aspect of the present disclosure, in the power transmission apparatus according to one of the fourteenth through sixteenth aspects, after the lapse of a predetermined time after the oscillation circuit switches the first frequency (f1) to the second frequency (f2) or switches the second frequency (f2) to the first frequency (f1), the measuring circuit may start monitoring an amplitude of a voltage or a current of the oscillated alternating current power, and when the amplitude converges to a fixed width, the measuring circuit may measure the input inductance values.

Immediately after switching the oscillation frequency, a transient response occurs, and thus, the input inductance values are not stably measured. According to the seventeenth aspect, however, measurements are started after the lapse of a predetermined time, and thus, it is possible to measure the input inductance values with high precision.

According to an eighteenth aspect of the present disclosure, in the power transmission apparatus according to one of the fourteenth through seventeenth aspects, the power transmission apparatus further comprises a power transmission circuit that wirelessly transmits power from the power transmission apparatus to the power reception apparatus by using a power transmission frequency and a control circuit that controls the power transmission circuit to wirelessly transmit power from the power transmission apparatus to the power reception apparatus or that causes the measuring circuit to detect the relative position of the second resonator to the first resonator by using the first frequency (f1) and the second frequency (f2).

According to the eighteenth aspect, upon completion of the positional adjustment of the second resonator to the first resonator, power is wirelessly transmitted from the power transmission apparatus to the power reception apparatus. Accordingly, it is possible to transmit power from the power transmission apparatus to the power reception apparatus with high efficiency while ensuring the safety.

According to a nineteenth aspect of the present disclosure, in the power transmission apparatus according to one of the fourteenth through eighteenth aspects: the first resonator may include a power transmission coil used for wirelessly transmitting power; and a switch for switching electrical connection between the oscillation circuit and the power transmission coil may be disposed, and the electrical connection between the oscillation circuit and the power transmission coil may be disconnected by using the switch when power is wirelessly transmitted.

According to the nineteenth aspect, power used for performing wireless transmission is higher than AC power used for performing position detection. Thus, if there is a possibility that the oscillation circuit will be burnt while power is being transmitted, a switch may be provided between the power transmission resonator and the oscillation circuit so that they will be electrically disconnected from each other while power is being wirelessly transmitted, thereby preventing power used for wireless transmission from flowing into the oscillation circuit that performs position detection.

According to a twentieth aspect of the present disclosure, in the power transmission apparatus according to one of the fourteenth through nineteenth aspects, a third resonator including a third coil used for wirelessly transmitting power from the power transmission apparatus to the power reception apparatus may be disposed separately from the first resonator.

According to the twentieth aspect, the first resonator including the first coil (detection coil) for positional adjustment is separately provided. Thus, the first coil and the third coil (power transmission coil) may be disposed at different positions, thereby increasing the flexibility in designing the power transmission apparatus.

If the second coil (power reception coil) is moving during power transmission (for example, the power reception apparatus is a vehicle in motion which is being charged from an in-vehicle charger, or a self-propelled robot), a temporal change in the coupling coefficient can be measured in real time while power is being transmitted. Based on the measurement results, for example, in accordance with the temporal change in the coupling coefficient, the power transmission frequency may be changed to the optimal value and power transmission may be terminated safely. This makes it possible to enhance the safety of the wireless power transfer system and also to enhance the power transfer efficiency.

According to a twenty-first aspect of the present disclosure, in the power transmission apparatus according to one of the fourteenth through twentieth aspects, after stopping wirelessly transmitting power, the control circuit may perform control so that energy stored in the first resonator will be released to a ground, and then may cause the measuring circuit to detect the relative position of the second resonator to the first resonator.

According to the twenty-first aspect, after energy stored in the first coil during the wireless power transfer mode is released to a ground, the wireless power transfer mode is shifted to the positional adjustment mode. This makes it possible to prevent the burning of a circuit used for positional adjustment.

According to a twenty-second aspect of the present disclosure, in the power transmission apparatus according to one of the fourteenth through twenty-first aspects, upon detecting that the relative position of the second resonator to the first resonator is a position at which the power transmission apparatus is able to wirelessly transmit power to the power reception apparatus, the control circuit may switch the first frequency (f1) and the second frequency (f2) to the power transmission frequency and may cause the power transmission apparatus to wirelessly transmit power to the power reception apparatus.

According to a twenty-third aspect of the present disclosure, the power transmission apparatus according to one of the fourteenth through twenty-second aspects may further include: a power transmission circuit that supplies power to the power transmission coil. The control circuit may control the power transmission circuit and the oscillation circuit, and may control the power transmission circuit in accordance with measurement results obtained by the measuring circuit so as to adjust a power transmission state.

According to the twenty-third aspect, based on the detection results obtained by the measuring circuit, for example, in accordance with the temporal change in the coupling coefficient, the power transmission frequency and the power transmission voltage may be changed to the optimal value and power transmission may be terminated safely. This makes it possible to enhance the safety of the wireless power transfer system and also to enhance the power transfer efficiency.

According to a twenty-fourth aspect of the present disclosure, in the power transmission apparatus according to one of the fourteenth through twenty-third aspects, the control circuit may determine a power transmission frequency and a power transmission voltage in accordance with detection results obtained by the measurement circuit.

According to the twenty-fourth aspect, based on the detection results obtained by the measuring circuit, for example, in accordance with the temporal change in the coupling coefficient, initial values of the power transmission frequency and the power transmission voltage may be changed to the optimal values and power transmission may be terminated safely. This makes it possible to enhance the safety of the wireless power transfer system and also to enhance the power transfer efficiency.

According to a twenty-fifth aspect of the present disclosure, the power transmission apparatus according to one of the fourteenth through twenty-fourth aspects may further include a display element. The control circuit may cause the display element to perform display when the coupling coefficient k exceeds a predetermined value.

According to the twenty-fifth aspect, when the coupling coefficient k exceeds a predetermined value, it is determined that the power reception resonator is located at a suitable position (at which the power reception apparatus can be charged) with respect to the position of the power transmission resonator. Then, the display element, such as a light source, a display, or a speaker, provided in the power transmission apparatus or the power reception apparatus performs display. With this arrangement, a detection result is supplied to a user as information in the form of light, video, or sound emitted from the display element. Then, the user can be informed that the power reception resonator is located at a suitable position (position at which the power reception apparatus can be charged) with respect to the position of the power transmission resonator. The display element is not restricted to an element presenting visual information, but also includes an element presenting only audio information (sound or voice).

According to a twenty-sixth aspect of the present disclosure, in the power transmission apparatus according to one of the fourteenth through twenty-fifth aspects: the power reception apparatus may include a display unit, and when the coupling coefficient k exceeds a predetermined value, the control circuit may perform control so that the power reception apparatus will send a control command for causing the display unit to display information indicating that the power reception apparatus is located in an area where the power reception apparatus is able to receive power from the power transmission apparatus.

According to the twenty-sixth aspect, the display unit is disposed in the power reception apparatus. Generally, a power reception apparatus is disposed above a power transmission apparatus. Accordingly, the display element provided in the power transmission apparatus may be hidden by the power reception apparatus. Thus, by providing the display unit in the power reception apparatus located above the power transmission apparatus, it is possible to inform a user that the power reception resonator is located at a suitable position (position at which the power reception apparatus can be charged) with respect to the position of the power transmission resonator. The display unit may be a large display screen provided in, for example, a smartphone, or may be a display element.

According to a twenty-seventh aspect of the present disclosure, there is provided a power transmission apparatus for detecting a position of a power reception apparatus that includes a load and a second resonator which is constituted by a parallel resonance circuit having a second coil and a capacitor. The power transmission apparatus includes: a first resonator including a first coil; an oscillation circuit that oscillates power used for wireless transmission at a first frequency (f1) which is lower than a resonant frequency (fr) of the second resonator and at a second frequency (f2) which is higher than the resonant frequency (fr); and a measuring circuit that measures an inductance value of the first resonator when the first resonator and the second resonator are electromagnetically coupled to each other. The measuring circuit measures an input inductance value Lin(f1) of the first resonator when the oscillation circuit oscillates power used for wireless transmission at the first frequency (f1) and an input inductance value Lin(f2) of the first resonator when the oscillation circuit oscillates power used for wireless transmission at the second frequency (f2) so as to detect a relative position of the second resonator to the first resonator on the basis of a ratio between the input inductance value Lin(f1) and the input inductance value Lin(f2).

According to the twenty-seventh aspect, the relative position of the second resonator to the first resonator is detected on the basis of the ratio between the input inductance value Lin(f1) and the input inductance value Lin(f2). The meaning of "on the basis of the ratio between the input inductance value Lin(f1) and the input inductance value Lin(f2)" will be explained below.

Expression $k^2 = 1 - \text{Lin}(f2)/\text{Lin}(f1)$ for calculating the coupling coefficient may be modified into expression $\text{Lin}(f2)/\text{Lin}(f1) = 1 - k^2$. Accordingly, if Lin(f2)/Lin(f1) is determined, the coupling coefficient can be uniquely determined. Thus, it is possible to detect the relative position of the second resonator to the first resonator on the basis of the ratio between the input inductance value Lin(f1) and the input inductance value Lin(f2).

The input inductance value Lin(f2) is measured when a capacitor is in the short-circuiting state, and thus, it is not vulnerable to the influence of a change in a load. In contrast, the input inductance value Lin(f1) is measured when a capacitor is in the opened state, and thus, it is vulnerable to the influence of a change in a load.

In the wireless power transfer system disclosed in International Publication No. 2011/033660 pamphlet, a load of the power reception apparatus is changed, and the power transmission apparatus measures a reflection coefficient in a predetermined frequency range, thereby estimating the coupling coefficient. In this case, if the load changes, the reflection coefficient also changes, and thus, the coupling coefficient changes, thereby failing to perform accurate positional adjustment. Compared with the estimation method disclosed in this publication in which a change in the load directly influences a change in the coupling coefficient, it is possible to perform more accurate positional adjustment by the use of the coupling coefficient determined in the expression $\text{Lin}(f2)/\text{Lin}(f1) = 1 - k^2$ in which only the input inductance value Lin(f1) is vulnerable to a change in the load. The mere provision of a capacitor at both ends of the second coil is sufficient. Thus, it is not necessary to provide a short-circuiting switch and a control circuit in the power reception apparatus, nor does it necessary to send a signal from the transmission apparatus to control the short-circuiting switch. Additionally, an increase in the cost is not substantially incurred.

In the twenty-seventh aspect, a short-circuiting load switch for switching between electrical connection and electrical disconnection between the power reception circuit and the load may be provided. Then, while the relative position of the second resonator to the first resonator is being detected, the electrical connection between the power reception circuit and the load may be disconnected by the short-circuiting load switch, thereby protecting the power reception circuit from being influenced by a change in the load. With this arrangement, it is possible to perform positional adjustment with high precision by detecting the relative position of the second resonator to the first resonator on the basis of the ratio between the input inductance value $Lin(f1)$ and the input inductance value $Lin(f2)$.

Generally, a protection circuit for preventing an overcurrent from flowing through the load is provided between the power reception circuit and the load. By using this protection circuit, when the amount by which the load has changed exceeds a threshold, the electrical connection between the power reception circuit and the load may be disconnected. Alternatively, the electrical connection between the power reception circuit and the load may be disconnected before starting power transmission, and then, the influence of the load on the input inductance value $Lin(f1)$ is eliminated, thereby estimating the coupling coefficient with even higher precision.

According to a twenty-eighth aspect of the present disclosure, in the power transmission apparatus according to the twenty-seventh aspect, the measuring circuit may detect the input inductance value $Lin(f1)$ of the first resonator measured by the measuring circuit when the oscillation circuit oscillates power used for wireless transmission at the first frequency (f1) and the input inductance value $Lin(f2)$ of the first resonator measured by the measuring circuit when the oscillation circuit oscillates power used for wireless transmission at the second frequency (f2), and may determine that the power reception apparatus is located in an area where the power reception apparatus is able to receive power from the power transmission apparatus when a difference between a ratio between the input inductance value $Lin(f1)$ and the input inductance value $Lin(f2)$ and a predetermined reference value is a predetermined threshold or smaller.

According to the twenty-eighth aspect, when the difference between $Lin(f2)/Lin(f1)$ or $Lin(f1)/Lin(f2)$, which is the ratio between the input inductance value $Lin(f1)$ and the input inductance value $Lin(f2)$, and the predetermined reference value is the predetermined threshold or smaller, it is determined that the power reception apparatus is located in an area where the power reception apparatus is able to receive power from the power transmission apparatus. With this method, it is possible to determine whether or not the power reception apparatus is located in an area where the power reception apparatus is able to receive power from the power transmission apparatus by a simple calculation, that is, $Lin(f2)/Lin(f1)$ or $Lin(f1)/Lin(f2)$. Thus, the need to determine the coupling coefficient k by complicated calculation processing for calculating $k^2=1-Lin(f2)/Lin(f1)$ is eliminated, thereby reducing the load of calculation processing performed by the measuring circuit.

According to a twenty-ninth aspect of the present disclosure, in the power transmission apparatus according to the twenty-seventh or twenty-eighth aspect: a power transmission frequency, the first frequency (f1), and the second frequency (f2) may be set in the oscillation circuit; and the power transmission apparatus may further include a control circuit that causes the power transmission apparatus to wirelessly transmit power to the power reception apparatus by using the power transmission frequency and that causes the measuring circuit to detect the relative position of the second resonator to the first resonator by using the first frequency (f1) and the second frequency (f2).

According to the twenty-ninth aspect, by using the single oscillation circuit, power is wirelessly transmitted from the power transmission apparatus to the power reception apparatus by using the power transmission frequency, and AC power is transmitted by using the first frequency (f1) and the second frequency (f2). Thus, the number of components is decreased, and the cost is accordingly reduced.

According to a thirtieth aspect of the present disclosure, in the power transmission apparatus according to one of the twenty-seventh through twenty-ninth aspects, when the second coil short-circuits, the input inductance value corresponding to the first frequency (f1) and the input inductance value corresponding to the second frequency (f2) may substantially coincide with each other.

According to a thirty-first aspect of the present disclosure, in the power transmission apparatus according to one of the twenty-seventh through thirtieth aspects, after the lapse of a predetermined time after the oscillation circuit switches the first frequency (f1) to the second frequency (f2) or switches the second frequency (f2) to the first frequency (f1), the measuring circuit may start monitoring an amplitude of a voltage or a current of the oscillated alternating current power, and when the amplitude converges to a fixed width, the measuring circuit may measure the input inductance values.

Immediately after switching the oscillation frequency, a transient response occurs, and thus, the input inductance values are not stably measured. According to the thirty-first aspect, however, measurements are started after the lapse of a predetermined time, and thus, it is possible to measure the input inductance values with high precision.

According to a thirty-second aspect of the present disclosure, in the power transmission apparatus according to one of the twenty-seventh through thirty-first aspects, the power transmission apparatus further comprises a power transmission circuit that wirelessly transmits power from the power transmission apparatus to the power reception apparatus by using a power transmission frequency and a control circuit that controls the power transmission circuit to wirelessly transmit power from the power transmission apparatus to the power reception apparatus or that causes the measuring circuit to detect the relative position of the second resonator to the first resonator by using the first frequency (f1) and the second frequency (f2).

According to the thirty-second aspect, upon completion of the positional adjustment of the second resonator to the first resonator, power is wirelessly transmitted from the power transmission apparatus to the power reception apparatus. Accordingly, it is possible to transmit power from the power transmission apparatus to the power reception apparatus with high efficiency while ensuring the safety.

According to a thirty-third aspect of the present disclosure, in the power transmission apparatus according to one of the twenty-seventh through thirty-second aspects: the first resonator may include a power transmission coil used for wirelessly transmitting power; and a switch for switching electrical connection between the oscillation circuit and the power transmission coil may be disposed, and the electrical connection between the oscillation circuit and the power transmission coil may be disconnected by using the switch when power is wirelessly transmitted.

According to the thirty-third aspect, power used for performing wireless transmission is higher than AC power used for performing position detection. Thus, if there is a possibility that the oscillation circuit will be burnt while power is being transmitted, a switch may be provided between the power transmission resonator and the oscillation circuit so that they will be electrically disconnected from each other while power is being wirelessly transmitted, thereby preventing power used for wireless transmission from flowing into the oscillation circuit that performs position detection.

According to a thirty-fourth aspect of the present disclosure, in the power transmission apparatus according to one of the twenty-seventh through thirty-third aspects, a third resonator including a third coil used for wirelessly transmitting power from the power transmission apparatus to the power reception apparatus may be disposed separately from the first resonator.

According to the thirty-fourth aspect, the first resonator including the first coil (detection coil) for positional adjustment is separately provided. Thus, the first coil and the third coil (power transmission coil) may be disposed at different positions, thereby increasing the flexibility in designing the power transmission apparatus.

If the second coil (power reception coil) is moving during power transmission (for example, the power reception apparatus is a vehicle in motion which is being charged from an in-vehicle charger, or a self-propelled robot), a temporal change in the coupling coefficient can be measured in real time while power is being transmitted. Based on the measurement results, for example, in accordance with the temporal change in the coupling coefficient, the power transmission frequency may be changed to the optimal value and power transmission may be terminated safely. This makes it possible to enhance the safety of the wireless power transfer system and also to enhance the power transfer efficiency.

According to a thirty-fifth aspect of the present disclosure, in the power transmission apparatus according to one of the twenty-seventh through thirty-fourth aspects, after stopping wirelessly transmitting power, the control circuit may perform control so that energy stored in the first resonator will be released to a ground, and then may cause the measuring circuit to detect the relative position of the second resonator to the first resonator.

According to the thirty-fifth aspect, after energy stored in the first coil during the wireless power transfer mode is released to a ground, the wireless power transfer mode is shifted to the positional adjustment mode. This makes it possible to prevent the burning of a circuit for positional adjustment.

According to a thirty-sixth aspect of the present disclosure, in the power transmission apparatus according to one of the twenty-seventh through thirty-fifth aspects, upon detecting that the relative position of the second resonator to the first resonator is a position at which the power transmission apparatus is able to wirelessly transmit power to the power reception apparatus, the control circuit may switch the first frequency (f1) and the second frequency (f2) to the power transmission frequency and may cause the power transmission apparatus to wirelessly transmit power to the power reception apparatus.

According to a thirty-seventh aspect of the present disclosure, the power transmission apparatus according to one of the twenty-seventh through thirty-sixth aspects may further include: a power transmission circuit that supplies power to the power transmission coil. The control circuit may control the power transmission circuit and the oscillation circuit, and may control the power transmission circuit in accordance with measurement results obtained by the measuring circuit so as to adjust a power transmission state.

According to the thirty-seventh aspect, based on the detection results obtained by the measuring circuit, for example, in accordance with the temporal change in the coupling coefficient, the power transmission frequency and the power transmission voltage may be changed to the optimal value and power transmission may be terminated safely. This makes it possible to enhance the safety of the wireless power transfer system and also to enhance the power transfer efficiency.

According to a thirty-eighth aspect of the present disclosure, in the power transmission apparatus according to one of the twenty-seventh through thirty-seventh aspects, the control circuit may determine a power transmission frequency and a power transmission voltage in accordance with detection results obtained by the measurement circuit.

According to the thirty-eighth aspect, based on the detection results obtained by the measuring circuit, for example, in accordance with the temporal change in the coupling coefficient, initial values of the power transmission frequency and the power transmission voltage may be changed to the optimal values and power transmission may be terminated safely. This makes it possible to enhance the safety of the wireless power transfer system and also to enhance the power transfer efficiency.

According to a thirty-ninth aspect of the present disclosure, the power transmission apparatus according to one of the twenty-seventh through thirty-eighth aspects may further include a display element. The control circuit may cause the display element to perform display when the coupling coefficient k exceeds a predetermined value.

According to the thirty-ninth aspect, when the coupling coefficient k exceeds a predetermined value, it is determined that the power reception resonator is located at a suitable position (at which the power reception apparatus can be charged) with respect to the position of the power transmission resonator. Then, the display element, such as a light source, a display, or a speaker, provided in the power transmission apparatus or the power reception apparatus performs display. Then, a detection result is supplied to a user as information in the form of light, video, or sound emitted from the display element. Then, the user can be informed that the power reception resonator is located at a suitable position (position at which the power reception apparatus can be charged) with respect to the position of the power transmission resonator. The display element is not restricted to an element presenting visual information, but also includes an element presenting only audio information (sound or voice).

According to a fortieth aspect of the present disclosure, in the power transmission apparatus according to one of the twenty-seventh through thirty-ninth aspects: the power reception apparatus may include a display unit, and when the coupling coefficient k exceeds a predetermined value, the control circuit may perform control so that the power reception apparatus will send a control command for causing the display unit to display information indicating that the power reception apparatus is located in an area where the power reception apparatus is able to receive power from the power transmission apparatus.

According to the fortieth aspect, the display unit is disposed in the power reception apparatus. Generally, a power reception apparatus is disposed above a power transmission apparatus. Accordingly, the display element provided in the power transmission apparatus may be hidden by the power reception apparatus. Thus, by providing the display unit in the power reception apparatus located above the power transmission apparatus, it is possible to inform a user that the power reception resonator is located at a suitable position (position at which the power reception apparatus can be charged) with respect to the position of the power transmission resonator. The display unit may be a large display screen provided in, for example, a smartphone, or may be a display element.

According to a forty-first aspect of the present disclosure, there is provided a power reception apparatus for detecting a position of a power transmission apparatus that includes a second resonator which is constituted by a parallel resonance circuit having a second coil and a capacitor. The power reception apparatus includes: a first resonator having a first coil; a load; an oscillation circuit that oscillates alternating current power at a first frequency (f1) which is lower than a resonant frequency (fr) of the second resonator and at a second frequency (f2) which is higher than the resonant frequency (fr); and a measuring circuit that measures an inductance value of the first resonator when the first resonator and the second resonator are electromagnetically coupled to each other. The measuring circuit measures an input inductance value Lin(f1) of the first resonator when the oscillation circuit oscillates alternating current power at the first frequency (f1) and an input inductance value Lin(f2) of the first resonator when the oscillation circuit oscillates alternating current power at the second frequency (f2), and calculates a coupling coefficient k by using an expression represented by $k^2=1-Lin(f2)/Lin(f1)$, thereby detecting a relative position of the second resonator to the first resonator on the basis of the coupling coefficient k.

According to the forty-first aspect, by disposing a capacitor at both ends of the second coil, a parallel resonance circuit including the second coil and the capacitor is provided in the power transmission apparatus. With this arrangement, when the power transmission apparatus is driven as a result of the oscillation circuit oscillating at the first frequency (f1) lower than the resonant frequency (fr) of the first resonator (power reception resonator), a current does not flow into the capacitor, thereby creating a state in which both ends of the second coil are substantially opened. On the other hand, when the power transmission apparatus is driven as a result of the oscillation circuit oscillating at the second frequency (f2) higher than the resonant frequency (fr), a current flows into the capacitor, thereby creating a state in which both ends of the second coil short-circuit.

Accordingly, in order to measure the inductance value Lin(f1) of the first resonator in the state in which both ends of the second coil are substantially opened, the oscillation circuit oscillates AC power at the first frequency (f1), and then, the inductance value Lin(f1) of the first resonator is measured. On the other hand, in order to measure the inductance value Lin(f2) of the first resonator in the state in which both ends of the second coil short-circuit, the oscillation circuit oscillates AC power at the second frequency (f2), and then, the inductance value Lin(f2) of the first resonator is measured. As a result, the coupling coefficient can be calculated from the measured inductance values Lin(f1) and Lin(f2) of the first resonator.

For example, in a wireless power transfer system disclosed in Japanese Unexamined Patent Application Publication No. 2009-118587, in order to calculate a coupling coefficient, it is necessary to provide, in a power reception apparatus, a short-circuiting switch for switching between a state in which both ends of a second coil are substantially opened and a state in which both ends of the second coil short-circuit and a first control circuit for controlling this short-circuiting switch. According to the forty-first aspect of the present disclosure, by merely providing a capacitor at both ends of the second coil, it is possible to create a state in which both ends of the second coil are substantially opened and a state in which both ends of the second coil short-circuit. Thus, it is not necessary to provide the above-described short-circuiting switch and first control circuit in the power transmission apparatus. As a result, since positional adjustment is performed by using the coupling coefficient, a power reception apparatus is able to perform high-precision positional adjustment with a simple configuration and without increasing the cost even if a load is changed.

Note that the definition of the coil in "both ends of a coil" is not restricted to a single coil component.

For example, a power transmission coil and a series resonance capacitor may be included in a power transmission resonator. In this case, if series impedance constituted by the power transmission coil and the series resonance capacitor appears to be inductive at the frequencies f1 and f2 at which position detection is performed, it may also be treated as an equivalent coil. Accordingly, by providing a parallel capacitor at both ends of this equivalent coil, advantages similar to the above-described advantages may be obtained. Thus, the definition of the coil in "both ends of the coil" is not restricted to a single coil component.

According to a forty-second aspect of the present disclosure, in the power reception apparatus according to the forty-first aspect, the power reception apparatus may include a display unit, and when the coupling coefficient k exceeds a predetermined value, the control circuit may cause the display unit to display information indicating that the power reception apparatus is located in an area where the power reception apparatus is able to receive power from the power transmission apparatus.

According to the forty-second aspect, the display unit is disposed in the power reception apparatus. Generally, a power reception apparatus is disposed above a power transmission apparatus. Accordingly, a display element provided in the power transmission apparatus may be hidden by the power reception apparatus. Thus, by providing the display unit in the power reception apparatus located above the power transmission apparatus, it is possible to inform a user that the power reception resonator is located at a suitable position (position at which the power reception apparatus can be charged from the power transmission apparatus) with respect to the position of the power transmission resonator. The display unit may be a large display screen provided in, for example, a smartphone, or may be a small display unit.

According to a forty-third aspect of the present disclosure, there is provided a power reception apparatus for detecting a position of a power transmission apparatus that includes a second resonator which is constituted by a parallel resonance circuit having a second coil and a capacitor. The power reception apparatus includes: a first resonator having a first coil; a load; an oscillation circuit that oscillates alternating current power at a first frequency (f1) which is lower than a resonant frequency (fr) of the second resonator and at a second frequency (f2) which is higher than the resonant frequency (fr); and a measuring circuit that measures an inductance value of the first resonator when the first resonator and the second resonator are electromagnetically coupled to each other. When a first inductance value corresponding to the first frequency (f1) is inversely proportional to the square of the first frequency (f1) and when a second inductance value corresponding to the second frequency (f2) is inversely proportional to the square of the second frequency (f2), the measuring circuit calculates a coupling coefficient k by using an expression represented by $k^2=1-f1^2/f2^2$, thereby detecting a relative position of the second resonator to the first resonator on the basis of the coupling coefficient k.

According to a forty-fourth aspect of the present disclosure, in the power reception apparatus according to the forty-third aspect, the power reception apparatus may include a display unit, and when the coupling coefficient k exceeds a predetermined value, the control circuit may cause the display unit to display information indicating that the power reception apparatus is located in an area where the power reception apparatus is able to receive power from the power transmission apparatus.

According to the forty-fourth aspect, the display unit is disposed in the power reception apparatus. Generally, a power reception apparatus is disposed above a power transmission apparatus. Accordingly, a display element provided in the power transmission apparatus may be hidden by the power reception apparatus. Thus, by providing the display unit in the power reception apparatus located above the power transmission apparatus, it is possible to inform a user that the power reception resonator is located at a suitable position (position at which the power reception apparatus can be charged from the power transmission apparatus) with respect to the position of the power transmission resonator. The display unit may be a large display screen provided in, for example, a smartphone, or may be a small display unit.

According to a forty-fifth aspect of the present disclosure, there is provided a power reception apparatus for detecting a position of a power transmission apparatus that includes a second resonator which is constituted by a parallel resonance circuit having a second coil and a capacitor. The power reception apparatus includes: a first resonator having a first coil; a load; an oscillation circuit that oscillates alternating current power at a first frequency (f1) which is lower than a resonant frequency (fr) of the second resonator and at a second frequency (f2) which is higher than the resonant frequency (fr); and a measuring circuit that measures an inductance value of the first resonator when the first resonator and the second resonator are electromagnetically coupled to each other. The measuring circuit measures an input inductance value Lin(f1) of the first resonator when the oscillation circuit oscillates power used for wireless transmission at the first frequency (f1) and an input inductance value Lin(f2) of the first resonator when the oscillation circuit oscillates power used for wireless transmission at the second frequency (f2), thereby detecting a relative position of the second resonator to the first resonator on the basis of a ratio between the input inductance value Lin(f1) and the input inductance value Lin(f2).

According to a forty-sixth aspect of the present disclosure, in the power reception apparatus according to the forty-fifth aspect, the measuring circuit may detect the input inductance value Lin(f1) of the first resonator measured by the measuring circuit when the oscillation circuit oscillates power used for wireless transmission at the first frequency (f1) and the input inductance value Lin(f2) of the first resonator measured by the measuring circuit when the oscillation circuit oscillates power used for wireless transmission at the second frequency (f2), and may determine that the power reception apparatus is located in an area where the power reception apparatus is able to receive power from the power transmission apparatus when a difference between the ratio between the input inductance value Lin(f1) and the input inductance value Lin(f2) and a predetermined reference value is a predetermined threshold or smaller.

According to the forty-sixth aspect, when the difference between the value of Lin(f2)/Lin(f1) or Lin(f1)/Lin(f2), which is the ratio between the input inductance value Lin(f1) and the input inductance value Lin(f2), and the predetermined reference value is the predetermined threshold or smaller, it is determined that the power reception apparatus is located in an area where it is able to receive power from the power transmission apparatus. With this method, it is possible to determine whether or not the power reception apparatus is located in an area where it is able to receive power from the power transmission apparatus by a simple calculation, that is, Lin(f2)/Lin(f1) or Lin(f1)/Lin(f2). Thus, the need to determine the coupling coefficient k by complicated calculation processing for calculating $k^2=1-f1^2/f2^2$ is eliminated, thereby reducing the load of calculation processing performed by the measuring circuit.

According to a forty-seventh aspect of the present disclosure, in the power reception apparatus according to the forty-fifth or forty-sixth aspect, the power reception apparatus may include a display unit, and when the coupling coefficient k exceeds a predetermined value, the control circuit may cause the display unit to display information indicating that the power reception apparatus is located in an area where the power reception apparatus is able to receive power from the power transmission apparatus.

According to the forty-seventh aspect, the display unit is disposed in the power reception apparatus. Generally, a power reception apparatus is disposed above a power transmission apparatus. Accordingly, a display element provided in the power transmission apparatus may be hidden by the power reception apparatus. Thus, by providing the display unit in the power reception apparatus located above the power transmission apparatus, it is possible to inform a user that the power reception resonator is located at a suitable position (position at which the power reception apparatus can be charged from the power transmission apparatus) with respect to the position of the power transmission resonator. The display unit may be a large display screen provided in, for example, a smartphone, or may be a small display unit.

According to a forty-eighth aspect of the present disclosure, there is provided a wireless power transfer system including: the power transmission apparatus according to one of the first through fortieth aspects; and the power reception apparatus.

According to a forty-ninth aspect of the present disclosure, there is provided a wireless power transfer system including: the power reception apparatus according to one of the forty-first through forty-seventh aspects; and the power transmission apparatus.

According to a fiftieth aspect of the present disclosure, there is provided a wireless power transfer system including: the power transmission apparatus according to one of the first through fortieth aspects; and the power reception apparatus according to one of the forty-first through forty-seventh aspects.

According to a fifty-first aspect of the present disclosure, there is provided a wireless power transfer system including a power transmission apparatus and a power reception apparatus. The power transmission apparatus includes a first resonator including a first coil, and an oscillation circuit that oscillates alternating current power at a first frequency (f1) which is lower than a resonant frequency (fr) of the second resonator and at a second frequency (f2) which is higher than the resonant frequency (fr). The power reception apparatus includes a load, a second resonator which is constituted by a parallel resonance circuit having a second coil and a capacitor, and a measuring circuit that measures an inductance value of the second resonator when the first resonator and the second resonator are electromagnetically coupled to each other. The measuring circuit measures an input inductance value Lin(f1) of the second resonator when the oscillation circuit oscillates alternating current power at the first frequency (f1) and an input inductance value Lin(f2) of the second resonator when the oscillation circuit oscillates alternating current power at the second frequency (f2), and calculates a coupling coefficient k by using an expression represented by $k^2=1-Lin(f2)/Lin(f1)$, thereby detecting a relative position of the second resonator to the first resonator on the basis of the coupling coefficient k.

According to a fifty-second aspect of the present disclosure, there is provided a position detection device for detecting a relative position of a second resonator to a first resonator which is electromagnetically coupled to the second resonator. The second resonator is constituted by a parallel resonance circuit having a coil and a capacitor. The position detection device includes: the first resonator; an oscillation circuit that oscillates at a first frequency (f1) which is lower than a resonant frequency (fr) of the second resonator and at a second frequency (f2) which is higher than the resonant frequency (fr); and a measuring circuit that measures an inductance value of the first resonator. The measuring circuit detects a relative position of the second resonator to the first resonator on the basis of a ratio between an input inductance value Lin(f1) of the first resonator measured by the measuring circuit when the oscillation circuit oscillates at the first frequency (f1) and an input inductance value Lin(f2) of the first resonator measured by the measuring circuit when the oscillation circuit oscillates at the second frequency (f2).

According to a fifty-third aspect of the present disclosure, in the position detection device according to the fifty-second aspect, the measuring circuit may detect the relative position on the basis of a coupling coefficient k calculated by using an expression represented by $k^2=1-Lin(f2)/Lin(f1)$.

According to a fifty-fourth aspect of the present disclosure, in the position detection device according to the fifty-second or fifty-third aspect: the oscillation circuit is a self-excited oscillation circuit in which the input inductance value is inversely proportional to the square of an oscillation frequency; and the measuring circuit may detect the relative position on the basis of a coupling coefficient k calculated by using an expression represented by $k^2=1-f1^2/f2^2$.

According to a fifty-fifth aspect of the present disclosure, in the position detection device according to one of the fifty-second through fifty-fourth aspects, when the coil short-circuits, the input inductance value corresponding to the first frequency (f1) and the input inductance value corresponding to the second frequency (f2) may substantially coincide with each other.

According to a fifty-sixth aspect of the present disclosure, in the position detection device according to one of the fifty-second through fifty-fifth aspects, the measuring circuit may measure the input inductance values when oscillation is stabilized after the lapse of a predetermined time after switching a frequency of the oscillation circuit.

According to a fifty-seventh aspect of the present disclosure, in the position detection device according to one of the fifty-second through fifty-sixth aspects, the first resonator may include a power transmission coil used for wireless power transfer, and a switch for switching electrical connection between the oscillation circuit and the power transmission coil may be disposed, thereby switching between a wireless-power-transfer power transmission mode and a position detection mode by using the switch.

According to a fifty-eighth aspect of the present disclosure, in the position detection device according to one of the fifty-second through fifty-seventh aspects, the first resonator may include a detection coil different from a power transmission coil used for wireless power transfer, and a relative position of the coil of the second resonator to the detection coil may be detected on the basis of a calculated coupling coefficient between the coil of the second resonator and the detection coil.

According to a fifty-ninth aspect of the present disclosure, in the position detection device according to one of the fifty-second through fifty-eighth aspects, when the wireless-power-transfer power transmission mode is switched to the position detection mode, after stopping power transmission, energy stored in the first resonator may be released to a ground, and then, the wireless-power-transfer power transmission mode may be switched to the position detection mode.

According to a sixtieth aspect of the present disclosure, there is provided a position detection device for detecting a relative position of a second resonator to a first resonator which is electromagnetically coupled to the second resonator. The first resonator is connected to an oscillation circuit that oscillates at a first frequency (f1) which is lower than a resonant frequency (fr) of the second resonator and at a second frequency (f2) which is higher than the resonant frequency (fr). The oscillation circuit is a self-excited oscillation circuit in which the input inductance value of the first resonator is inversely proportional to the square of an oscillation frequency. The position detection device includes: a second resonator which is constituted by a parallel resonance circuit having a coil and a capacitor; and a measuring circuit that measures a frequency of the second resonator. The measuring circuit detects a relative position of the second resonator to the first resonator on the basis of a ratio between a frequency f1 measured by the measuring circuit when the oscillation circuit oscillates at the first frequency (f1) and a frequency f2 measured by the measuring circuit when the oscillation circuit oscillates at the second frequency (f2).

According to a sixty-first aspect of the present disclosure, there is provided a position detection device for detecting a relative position of a first resonator to a second resonator which is electromagnetically coupled to the first resonator. The first resonator is constituted by a parallel resonance circuit having a coil and a capacitor. The position detection device includes: the second resonator; an oscillation circuit that oscillates at a first frequency (f1) which is lower than a resonant frequency (fr) of the first resonator and at a second frequency (f2) which is higher than the resonant frequency (fr); and a measuring circuit that measures an inductance value of the second resonator. The measuring circuit detects a relative position of the first resonator to the second resonator on the basis of a ratio between an input inductance value Lin(f1) of the second resonator measured by the measuring circuit when the oscillation circuit oscillates at the first frequency (f1) and an input inductance value Lin(f2) of the second resonator measured by the measuring circuit when the oscillation circuit oscillates at the second frequency (f2).

According to a sixty-second aspect of the present disclosure, in the position detection device according to the sixty-first aspect, the measuring circuit may detect the relative position on the basis of a coupling coefficient k calculated by using an expression represented by $k^2=1-\text{Lin}(f2)/\text{Lin}(f1)$.

According to a sixty-third aspect of the present disclosure, in the position detection device according to the sixty-first aspect: the oscillation circuit is a self-excited oscillation circuit in which the input inductance value is inversely proportional to the square of an oscillation frequency; and the measuring circuit may detect the relative position on the basis of a coupling coefficient k calculated by using an expression represented by $k^2=1-f1^2/f2^2$.

According to a sixty-fourth aspect of the present disclosure, the position detection device according to one of the fifty-second through sixty-third aspects may include: a first display element; and a control circuit that controls the first display element. The control circuit may control a display state of the first display element in accordance with a calculated coupling coefficient, and may cause the first display element to display information that positional adjustment of the second resonator to the first resonator has implemented when the calculated coupling coefficient exceeds a predetermined value.

According to a sixty-fifth aspect of the present disclosure, the position detection device according to one of the fifty-second through sixty-third aspects may include: a second display element; and a control circuit that controls the second display element. The control circuit may control a display state of the second display element in accordance with a calculated coupling coefficient, and may cause the second display element to display information that positional adjustment of the second resonator to the first resonator has implemented when the calculated coupling coefficient exceeds a predetermined value.

According to a sixty-sixth aspect of the present disclosure, there is provided a power transmission apparatus including: the position detection device according to one of the fifty-second through sixty-fifth aspects; a power transmission circuit that supplies power to the power transmission coil; and a power transmission control circuit that controls the power transmission circuit and the oscillation circuit.

According to a sixty-seventh aspect of the present disclosure, there is provided a power transmission apparatus including: the position detection device according to one of the fifty-second through sixty-fifth aspects; a power transmission circuit that supplies power to the power transmission coil; and a power transmission control circuit that controls the power transmission circuit and the oscillation circuit. The power transmission control circuit controls the power transmission circuit in accordance with a measurement result obtained by the position detection device so as to adjust a power transmission state.

According to a sixty-eighth aspect of the present disclosure, in the power transmission apparatus according to sixty-sixth or sixty-seventh aspect, the power transmission control circuit determines a power transmission frequency and a power transmission voltage in accordance with a detection result obtained by the position detection device.

According to a sixty-ninth aspect of the present disclosure, there is provided a power reception apparatus including: the position detection device according to one of the fifty-second through sixty-fifth aspects; and a power reception circuit that supplies power which is received by the second resonator from the first resonator through wireless power transfer to a load.

A position detection device, a position adjustment device, and a wireless power transfer system according to an embodiment of the present disclosure find widespread application in the use for charging or supplying power to, for example, electric vehicles, AV machines, batteries, and medical equipment. Alternatively, by integrating a power reception resonator into an RF tag and by integrating a power transmission resonator into a reader/writer for the RF tag, a position detection device, a position adjustment device, and a wireless power transfer system according to an embodiment may be used for detecting the positional displacement of products or product parts, for example, in a factory. According to an embodiment of the present disclosure, it is possible to suppress a decrease in the efficiency caused by the positional displacement or the occurrence of abnormal heating of a metal due to leakage flux.

What is claimed is:

1. A power transmission apparatus having a first resonator and detecting a position of a power reception apparatus that includes a load and a second resonator, the first resonator including a first coil, the second resonator including a parallel resonance circuit having a second coil and a capacitor, the power transmission apparatus comprising:
    an oscillation circuit that oscillates alternating current power at a first frequency (f1) which is lower than a resonant frequency (fr) of the second resonator and oscillates alternating current power at a second frequency (f2) which is higher than the resonant frequency (fr); and
    a measuring circuit, which in operation:
    measures inductance values of the first resonator when the first resonator is electromagnetically coupled to the second resonator;
    measures an inductance value Lin (f1) when the oscillation circuit oscillates alternating current power at the first frequency (f1), an inductance value Lin (f2) when the oscillation circuit oscillates alternating current power at the second frequency (f2);
    calculates a coupling coefficient k by using an expression represented by $k^2=1-\text{Lin}(f2)/\text{Lin}(f1)$; and
    detects a relative position of the second resonator to the first resonator using the coupling coefficient k.

2. The power transmission apparatus according to claim 1, further comprises a control circuit, which in operation:
    causes the power transmission apparatus to wirelessly transmit power to the power reception apparatus by using a power transmission frequency; and
    causes the measuring circuit to detect the relative position of the second resonator to the first resonator by using the first frequency (f1) and the second frequency (f2).

3. The power transmission apparatus according to claim 2, further comprising a third resonator that includes a third coil used for wirelessly transmitting power from the power transmission apparatus to the power reception apparatus, the third coil being distinct from the first coil,
    wherein the control circuit controls the oscillation circuit to switch from the first frequency (f1) or the second frequency (f2) oscillated by the oscillation circuit to the power transmission frequency oscillated by the power transmission circuit, and wirelessly transmit the power from the power transmission apparatus to the power reception apparatus through the power transmission circuit.

4. The power transmission apparatus according to claim 3, wherein, after the control circuit stops the oscillation by the oscillation circuit of the alternating current power and controls the first resonator to release energy stored in the first resonator to a ground, the control circuit causing the measuring circuit to detect the relative position of the second resonator to the first resonator.

5. The power transmission apparatus according to claim 2, wherein, upon detecting that the relative position of the second resonator to the first resonator is a position at which the power transmission apparatus is able to wirelessly transmit power to the power reception apparatus, the control circuit controls the oscillation circuit switch the first frequency (f1) or the second frequency (f2) to the power transmission frequency and causes the power transmission apparatus to wirelessly transmit power to the power reception apparatus.

6. The power transmission apparatus according to claim 2, further comprising:
a power transmission circuit that supplies the power to the first coil,
wherein the control circuit controls the power transmission circuit and the oscillation circuit in accordance with the inductance value Lin (f1) and the inductance value Lin (f2) measured by the measuring circuit to determine the power transmission frequency and a power transmission voltage of the wirelessly transmitting power.

7. The power transmission apparatus according to claim 2, further comprising:
a display element,
wherein the control circuit causes the display element to perform a display regarding when the coupling coefficient k exceeds a predetermined value.

8. The power transmission apparatus according to claim 2, wherein:
the power reception apparatus further includes a display unit; and
when the coupling coefficient k exceeds a predetermined value, the control circuit sends a control command to the power reception apparatus, the control command causing the display unit to display information indicating that the power reception apparatus is located in an area where the power reception apparatus is able to receive the power from the power transmission apparatus.

9. The power transmission apparatus according to claim 1, wherein, when the second coil short-circuits, the inductance value Lin (f1) corresponding to the first frequency (f1) substantially coincides with the inductance value Lin (f2) corresponding to the second frequency (f2).

10. The power transmission apparatus according to claim 1, wherein, after the oscillation circuit switches the first frequency (f1) to the second frequency (f2) or switches the second frequency (f2) to the first frequency (f1), the measuring circuit starts monitoring an amplitude of a voltage or an amplitude of a current of the oscillated alternating current power, and
when the amplitude of the voltage to the amplitude of the current converges to a fixed width, the measuring circuit measures the inductance values Lin (f1) and the inductance values Lin (f2).

11. The power transmission apparatus according to claim 1, further comprising:
a power transmission circuit that wirelessly transmits power from the power transmission apparatus to the power reception apparatus by using a power transmission frequency and a control circuit that controls the power transmission circuit to wirelessly transmit power from the power transmission apparatus to the power reception apparatus or that causes the measuring circuit to detect the relative position of the second resonator to the first resonator by using the first frequency (f1) and the second frequency (f2).

12. The power transmission apparatus according to claim 11, wherein:
the first coil is used for wirelessly transmitting power; and
the power transmission apparatus further comprises a switch for switching electrical connection between the oscillation circuit and the first coil, the switch disconnecting the electrical connection between the oscillation circuit and the first coil when the power is wirelessly transmitted.

13. A wireless power transfer system comprising:
the power transmission apparatus according to claim 1; and
the power reception apparatus.

* * * * *